(12) United States Patent
Shang et al.

(10) Patent No.: US 11,232,734 B2
(45) Date of Patent: Jan. 25, 2022

(54) SHIFT REGISTER UNIT, DRIVING METHOD, GATE DRIVING CIRCUIT AND DISPLAY DEVICE

(71) Applicant: BOE TECHNOLOGY GROUP CO., LTD., Beijing (CN)

(72) Inventors: Guangliang Shang, Beijing (CN); Can Zheng, Beijing (CN); Jiangnan Lu, Beijing (CN); Tian Dong, Beijing (CN); Libin Liu, Beijing (CN); Long Han, Beijing (CN); Shiming Shi, Beijing (CN); Dawei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/964,465

(22) PCT Filed: Sep. 25, 2019

(86) PCT No.: PCT/CN2019/107723
§ 371 (c)(1),
(2) Date: Jul. 23, 2020

(87) PCT Pub. No.: WO2021/056239
PCT Pub. Date: Apr. 1, 2021

(65) Prior Publication Data
US 2021/0090484 A1 Mar. 25, 2021

(51) Int. Cl.
*G09G 3/20* (2006.01)
*G11C 19/28* (2006.01)

(52) U.S. Cl.
CPC .............. *G09G 3/20* (2013.01); *G11C 19/28* (2013.01); *G09G 2300/0426* (2013.01);
(Continued)

(58) Field of Classification Search
CPC ............. G09G 3/20; G09G 2300/0426; G09G 2300/08; G09G 2310/0243;
(Continued)

(56) References Cited

U.S. PATENT DOCUMENTS 10,078,987 B2 * 9/2018 Lee ...................... G09G 3/3677
10,553,166 B2 * 2/2020 Seo ...................... G09G 3/3677
(Continued)

FOREIGN PATENT DOCUMENTS

CN    101241247 A    8/2008
CN    103208251 A    7/2013
(Continued)

*Primary Examiner* — Sejoon Ahn
(74) *Attorney, Agent, or Firm* — Muncy, Geissler, Olds and Lowe, P.C.

(57) ABSTRACT

A shift register unit, a driving method, a gate driving circuit and a display device are provided. The shift register unit includes a first gate driving output circuit and a second gate driving output circuit. The first gate driving output circuit is used to output a first gate driving signal through the first gate driving signal output terminal; the second gate driving output circuit is used to generate a second gate driving signal outputted simultaneously with the first gate driving signal based on the first gate driving signal, a first clock signal and a second clock signal. In the present disclosure, the second gate driving output circuit is added, the first gate driving signal, the first clock signal, and the second clock signal are used to generate an inverted second gate driving signal, so that positive and negative switching control signals are generated by one stage of shift register unit.

20 Claims, 17 Drawing Sheets

(52) U.S. Cl.
CPC . *G09G 2300/08* (2013.01); *G09G 2310/0243* (2013.01); *G09G 2310/0267* (2013.01); *G09G 2310/0286* (2013.01); *G09G 2310/08* (2013.01)

(58) Field of Classification Search
CPC ... G09G 2310/0267; G09G 2310/0286; G09G 2310/08; G11C 19/28
See application file for complete search history.

(56) References Cited

U.S. PATENT DOCUMENTS

| | | | |
|---|---|---|---|
| 2003/0043104 A1* | 3/2003 | Lee | G02F 1/1345 345/92 |
| 2007/0296682 A1* | 12/2007 | Hwang | G11C 19/00 345/100 |
| 2008/0192883 A1 | 8/2008 | Chang et al. | |
| 2015/0243237 A1 | 8/2015 | Li et al. | |
| 2018/0301100 A1 | 10/2018 | Li et al. | |
| 2019/0073948 A1 | 3/2019 | Wang | |
| 2020/0043988 A1* | 2/2020 | Zhang | G02F 1/1333 |
| 2020/0045820 A1* | 2/2020 | Jin | G09G 3/20 |
| 2020/0051213 A1* | 2/2020 | Nallam | G09G 5/39 |
| 2020/0051477 A1* | 2/2020 | Huang | H04N 5/23216 |

FOREIGN PATENT DOCUMENTS

| | | |
|---|---|---|
| CN | 106601190 A | 4/2017 |
| CN | 106847225 A | 6/2017 |
| JP | 2014093100 A | 5/2014 |

\* cited by examiner

SHIFT REGISTER UNIT, DRIVING METHOD, GATE DRIVING CIRCUIT AND DISPLAY DEVICE

CROSS-REFERENCE TO RELATED APPLICATION

The present application is the U.S. national phase of PCT Application No. PCT/CN2019/107723 filed on Sep. 25, 2019, which is incorporated herein by reference in its entirety.

TECHNICAL FIELD

The present disclosure relates to the field of display technology, in particular to a shift register unit, a driving method, a gate driving circuit and a display device.

BACKGROUND

In the field of display technology, in order to keep the brightness fluctuation of pixels within a reasonable range, because the voltage that controls the brightness will change with time due to current leakage, the data still needs to be refreshed when a static image is shown. In order to reduce power consumption, it is an effective method to reduce the refresh frequency. At the same time, the display quality needs to be maintained, and the speed of current leakage of pixels needs to be reduced. The oxide semiconductor transistor has ultra-low current leakage characteristics to meet this demand. In the related art, it is different to provide a switching control signal to the pixels so as to ensure a pixel charging speed and a small parasitic capacitance.

SUMMARY

In a first aspect, a shift register unit includes a first gate driving output circuit and a second gate driving output circuit, wherein the first gate driving output circuit is configured to output a first gate driving signal through a first gate driving signal output terminal; and the second gate driving output circuit is configured to generate a second gate driving signal outputted simultaneously with the first gate driving signal based on the first gate driving signal, a first clock signal, and a second clock signal.

In some embodiments of the present disclosure, the first gate driving signal and the second gate driving signal are inverted in phase.

In some embodiments of the present disclosure, the second gate driving circuit comprises a first pull-down node control circuit, a pull-down circuit, and an output control circuit, wherein the output control circuit is used to control connection or disconnection between a second gate driving signal output terminal and a first voltage terminal under the control of the first gate driving signal; the first pull-down node control circuit is used to control a potential of a first pull-down node under the control of the first gate driving signal, the first clock signal, and the second clock signal; and the pull-down circuit is used to control connection or disconnection between the second gate driving signal output terminal and a second voltage terminal under the control of the potential of the first pull-down node.

In some embodiments of the present disclosure, the first pull-down node control circuit is electrically connected to a first gate driving signal output terminal, the first clock signal terminal, the second clock signal terminal, the first pull-down node, the first voltage terminal and a third voltage terminal, and is configured to control connection or disconnection between the first pull-down node and the first voltage terminal under the control of the first gate driving signal, control connection or disconnection between the first pull-down node and the third voltage terminal under the control of the first clock signal, and control the potential of the first pull-down node based on the second clock signal.

In some embodiments of the present disclosure, the first pull-down node control circuit is further configured to control the potential of the first pull-down node based on the second gate driving signal.

In some embodiments of the present disclosure, the first pull-down node control circuit comprises a first pull-down node control transistor, a second pull-down node control transistor, and a first pull-down node control capacitor, a control electrode of the first pull-down node control transistor is electrically connected to the first gate driving signal output terminal, and a first electrode of the first pull-down node control transistor is electrically connected to the first voltage terminal, and a second electrode of the first pull-down node control transistor is electrically connected to the first pull-down node; a control electrode of the second pull-down node control transistor is electrically connected to the first clock signal terminal, a first electrode of the second pull-down node control transistor is electrically connected to the first pull-down node, and a second electrode of the second pull-down node control transistor is electrically connected to the third voltage terminal; and a first terminal of the first pull-down node control capacitor is electrically connected to the first pull-down node, and a second terminal of the first pull-down node control capacitor is electrically connected to the second clock signal terminal.

In some embodiments of the present disclosure, the first pull-down node control circuit further comprises a second pull-down node control capacitor, a first terminal of the second pull-down node control capacitor is electrically connected to the first pull-down node, and a second terminal of the second pull-down node control capacitor is electrically connected to the second gate driving signal output terminal.

In some embodiments of the present disclosure, the output control circuit comprises an output control transistor, a control electrode of the output control transistor is electrically connected to the first gate driving signal output terminal, a first electrode of the output control transistor is electrically connected to the first voltage terminal, and a second electrode of the output control transistor is electrically connected to the second gate driving signal output terminal.

In some embodiments of the present disclosure, the output control transistor comprises a first transistor and a second transistor, a control electrode of the first transistor is electrically connected to a control electrode of the second transistor, a first electrode of the first transistor is the first electrode of the output control transistor, a second electrode of the first transistor is electrically connected to a first electrode of the second transistor, a second electrode of the second transistor is the second electrode of the output control transistor.

In some embodiments of the present disclosure, the control electrode of the output control transistor comprises a top gate and a bottom gate electrically connected to each other.

In some embodiments of the present disclosure, the pull-down circuit comprises a pull-down transistor, a control electrode of the pull-down transistor is electrically connected to the first pull-down node, a first electrode of the pull-down transistor is electrically connected to the second gate driving signal output terminal, and a second electrode of the pull-down transistor is electrically connected to the second voltage terminal.

In some embodiments of the present disclosure, the control electrode of the pull-down transistor comprises a top gate and a bottom gate electrically connected to each other.

In some embodiments of the present disclosure, the first gate driving output circuit is used to control to output the first gate driving signal under the control of the third clock signal and the fourth clock signal, the first pull-down node control circuit includes a first pull-down node control transistor, a second pull-down node control transistor, a first pull-down node control capacitor, and a second pull-down node control capacitor, and the pull-down circuit includes a pull-down transistor; a control electrode of the first pull-down node control transistor is electrically connected to the first gate driving signal output terminal, and a first electrode of the first pull-down node control transistor is electrically connected to the first voltage terminal, and a second electrode of the first pull-down node control transistor is electrically connected to the first pull-down node; a control electrode of the second pull-down node control transistor is electrically connected to the first clock signal terminal, a first electrode of the second pull-down node control transistor is electrically connected to the first pull-down node, and a second electrode of the second pull-down node control transistor is electrically connected to the third voltage terminal; a first end of the first pull-down node control capacitor is electrically connected to the first pull-down node, and a second end of the first pull-down node control capacitor is electrically connected to the second clock signal terminal; a first end of the second pull-down node control capacitor is electrically connected to the first pull-down node, and a second end of the second pull-down node control capacitor is connected to the second gate driving signal output terminal; and a control electrode of the pull-down transistor is electrically connected to the first pull-down node, a first electrode of the pull-down transistor is electrically connected to the second gate driving signal output terminal, and a second electrode of the pull-down transistor is electrically connected to the second voltage terminal.

In some embodiments of the present disclosure, the first pull-down node control transistor includes a third transistor and a fourth transistor connected in series with each other; and/or, the second pull-down node control transistor includes a fifth transistor and a sixth transistor connected in series with each other; a control electrode of the third transistor is electrically connected to a control electrode of the fourth transistor, a first electrode of the third transistor is the first electrode of the first pull-down node control transistor, and a second electrode of the third transistor is electrically connected to a first electrode of the fourth transistor, a second electrode of the fourth transistor is the second electrode of the first pull-down node control transistor; a control electrode of the fifth transistor is electrically connected to a control electrode of the sixth transistor, a first electrode of the fifth transistor is the first electrode of the second pull-down node control transistor, a second electrode of the fifth transistor is electrically connected to a first electrode of the sixth transistor, and a second electrode of the sixth transistor is the second electrode of the second pull-down node control transistor.

In some embodiments of the present disclosure, the control electrode of the first pull-down node control transistor includes a top gate and a bottom gate electrically connected to each other; and/or, the control electrode of the second pull-down node control transistor includes a top gate and a bottom gate electrically connected to each other.

In some embodiments of the present disclosure, the second voltage terminal is used to input a second voltage, and the third voltage terminal is used to input a third voltage; transistors included in the first pull-down node control circuit and pull-down transistors included in the pull-down circuit are both p-type transistors, and the third voltage is less than the second voltage; or the transistors included in the first pull-down node control circuit and the pull-down transistors included in the pull-down circuit are n-type transistors, and the third voltage is greater than the second voltage.

In some embodiments of the present disclosure, the first gate driving output circuit includes a pull-up node control circuit, a pull-down input node control circuit, and a second pull-down node control circuit and an output circuit, the pull-up node control circuit is used to control the potential of the pull-up node under the control of the third clock signal and the potential of the pull-down input node, and maintain the potential of the pull-up node; the pull-down input node control circuit is used to control connection or disconnection between the input terminal and the pull-down input node under the control of the third clock signal, and control connection or disconnection between the pull-down input node and the fourth voltage terminal under the control of the potential of the pull-up node and the fourth clock signal; the second pull-down node control circuit is used to control connection or disconnection between the pull-down input node and the second pull-down node under the control of a fifth voltage signal, and maintain the potential of the second pull-down node; the output circuit is used to control the first gate driving signal output terminal to output the first gate driving signal based on the fourth clock signal under the control of the potential of the pull-up node and the potential of the second pull-down node.

In some embodiments of the present disclosure, the pull-up node control circuit includes a first pull-up node control transistor, a second pull-up node control transistor, and a pull-up node control capacitor, a control electrode of the first pull-up node control transistor is electrically connected to the third clock signal terminal, a first electrode of the first pull-up node control transistor is electrically connected to a sixth voltage terminal, and a second electrode of the first pull-up node control transistor is electrically connected to the pull-up node; a control electrode of the second pull-up node control transistor is electrically connected to the pull-down input node, a first electrode of the second pull-up node control transistor is electrically connected to the pull-up node, and a second electrode of the second pull-up node control transistor is electrically connected to the third clock signal terminal; and a first end of the pull-up node control capacitor is electrically connected to the pull-up node, and a second end of the pull-up node control capacitor is electrically connected to a seventh voltage terminal.

In some embodiments of the present disclosure, the first pull-up node control transistor includes a seventh transistor and an eighth transistor connected in series with each other; and/or the second pull-up node control transistor includes a ninth transistor and a tenth transistor connected in series; a control electrode of the seventh transistor is electrically connected to a control electrode of the eighth transistor, a first electrode of the seventh transistor is the first electrode of the first pull-up node control transistor, a second electrode of the seventh transistor is electrically connected to a first electrode of the eighth transistor, a second electrode of the eighth transistor is the second electrode of the first pull-up node control transistor; a control electrode of the ninth transistor is electrically connected to a control electrode of the tenth transistor, a first electrode of the ninth transistor is the first electrode of the second pull-up node control transistor, a second electrode of the ninth transistor is electrically connected to a first electrode of the tenth transistor, a second electrode of the tenth transistor is the second electrode of the second pull-up node control transistor.

In some embodiments of the present disclosure, the control electrode of the first pull-up node control transistor includes a top gate and a bottom gate electrically connected to each other; and/or, the control electrode of the second pull-up node control transistor includes a top gate and a bottom gate electrically connected to each other.

In some embodiments of the present disclosure, the pull-down input node control circuit includes a first pull-down input node control transistor, a second pull-down input node control transistor, and a third pull-down input node control transistor, a control electrode of the first pull-down input node control transistor is electrically connected to the third clock signal terminal, a first electrode of the first pull-down input node control transistor is electrically connected to the input terminal, and a second electrode of the first pull-down input node control transistor is electrically connected to the pull-down input node; a control electrode of the second pull-down input node control transistor is electrically connected to the pull-up node, and a first electrode of the second pull-down input node control transistor is electrically connected to the fourth voltage terminal; a control electrode of the third pull-down input node control transistor is electrically connected to the fourth clock signal terminal, and a first electrode of the third pull-down input node control transistor is electrically connected to the second electrode of the second pull-down input node control transistor, a second electrode of the third pull-down input node control transistor is electrically connected to the pull-down input node; the second pull-down node control circuit includes a control transistor and a control capacitor; a control electrode of the control transistor is electrically connected to the fifth voltage terminal, a first electrode of the control transistor is electrically connected to the pull-down input node, and a second electrode of the control transistor is electrically connected to the second pull-down node; a first end of the control capacitor is electrically connected to the second pull-down node, and a second end of the control capacitor is electrically connected to the first gate driving signal output end; the output circuit includes a first output transistor and a second output transistor; a control electrode of the first output transistor is electrically connected to the pull-up node, a first electrode of the first output transistor is electrically connected to a seventh voltage terminal, and a second electrode of the first output transistor is electrically connected to the first gate driving signal output terminal; a control electrode of the second output transistor is electrically connected to the second pull-down node, a first electrode of the second output transistor is electrically connected to the first gate driving signal output terminal, and a second electrode of the second output transistor is electrically connected to the fourth clock signal terminal.

In some embodiments of the present disclosure, the first pull-down input node control transistor includes an eleventh transistor and a twelfth transistor; and/or the second pull-down input node control transistor includes a thirteenth transistor and a fourteenth transistor; a control electrode of the eleventh transistor is electrically connected to a control electrode of the twelfth transistor, a first electrode of the eleventh transistor is the first electrode of the first pull-down input node control transistor, a second electrode of the eleventh transistor is electrically connected to a first electrode of the twelfth transistor, a second electrode of the twelfth transistor is the second electrode of the first pull-down input node control transistor; a control electrode of the thirteenth transistor is electrically connected to a control electrode of the fourteenth transistor, a first electrode of the thirteenth transistor is the first electrode of the second pull-down input node control transistor, a second electrode of the thirteenth transistors is electrically connected to a first electrode of the fourteenth transistor, a second electrode of the fourteenth transistor is the second electrode of the second pull-down input node control transistor.

In some embodiments of the present disclosure, the control transistor includes a fifteenth transistor and a sixteenth transistor connected in series with each other; and/or the second output transistor includes a seventeenth transistor and an eighteenth transistor connected in series with each other; a control electrode of the fifteenth transistor is electrically connected to a control electrode of the sixteenth transistor, a first electrode of the fifteenth transistor is the first electrode of the control transistor, a second electrode of the fifteenth transistor is electrically connected to a first electrode of the sixteenth transistor, and a second electrode of the sixteenth transistor is the second electrode of the control transistor; a control electrode of the seventeenth transistor is electrically connected to a control electrode of the eighteenth transistor, a first electrode of the seventeenth transistor is the first electrode of the second output transistor, and a second electrode of the seventeenth transistor is electrically connected to a first electrode of the eighteenth transistor, and a second electrode of the eighteenth transistor is the second electrode of the second output transistor.

In some embodiments of the present disclosure, the control electrode of the first pull-down input node control transistor includes a top gate and a bottom gate electrically connected to each other; and/or the control electrode of the second pull-down input node control transistor includes a top gate and a bottom gate electrically connected to each other.

In some embodiments of the present disclosure, the control electrode of the control transistor includes a top gate and a bottom gate electrically connected to each other; and/or the control electrode of the second output transistor includes a top gate and a bottom gate electrically connected to each other.

In some embodiments of the present disclosure, the control electrode of the first output transistor includes a top gate and a bottom gate electrically connected to each other; and/or the control electrode of the third pull-down input node control transistor includes a top gate and a bottom gate electrically connected to each other.

In a second aspect a driving method applied to the shift register unit, the driving method includes: in the output phase, the first gate driving output circuit outputting the first level; the potential of the first clock signal being the second level, the potential of the second clock signal being the first level, and the second gate driving output circuit controlling the potential of the second gate driving signal to be the second level under the control of the first gate driving signal; in the reset phase, the first gate driving output circuit outputting the second level, the potential of the first clock signal being the first level, the potential of the second clock signal being the second level, and the second gate driving output circuit controlling the potential of the second gate driving signal to be the first level under the control of the first clock signal; and in the output cut-off maintenance phase, the first gate driving output circuit outputting the second level, and the second gate driving output circuit controlling the potential of the second gate driving signal to be the first level under the control of the first clock signal and the second clock signal.

In some embodiments of the present disclosure, the second gate driving circuit includes a first pull-down node control circuit, a pull-down circuit, and an output control circuit, the second gate driving output circuit controlling the potential of the second gate driving signal to be the second level under the control of the first gate driving signal includes: controlling, by the output control circuit, the connection between the second gate driving signal output terminal and the first voltage terminal under the control of the first gate driving signal, so as to control the potential of the second gate driving signal to be the second level; and the second gate driving output circuit controlling the potential of the second gate driving signal to be the first level under the control of the first clock signal may includes: controlling, by the first pull-down node control circuit, connection between the first pull-down node and the third voltage terminal under the control of the first clock signal to control the potential of the first pull-down node to be the first level; and controlling, by the pull-down circuit, connection between the second gate driving signal output terminal and the second voltage terminal under the control of the potential of the first pull-down node, to control the potential of the second gate driving signal to be the first level.

In some embodiments of the present disclosure, the second gate driving circuit includes a first pull-down node control circuit, a pull-down circuit, and an output control circuit; the output cut-off maintenance phase includes a plurality of maintenance time periods set in sequence; the maintenance time period includes a first maintenance sub-time period and a second maintenance sub-time period set in sequence; in the output cut-off maintenance phase, the first gate driving output circuit outputs the second level, and the second gate driving output circuit controls the potential of the second gate driving signal to be the first level under the control of the first clock signal and the second clock signal; in the first maintenance sub-time period, the first gate driving output circuit outputs the second level, the potential of the first clock signal is the second level, and the potential of the second clock signal is the first level, the first pull-down node control circuit maintains the potential of the first pull-down node at the first level under the control of the second clock signal, and the pull-down circuit controls connection between the second gate driving signal output terminal and the second voltage terminal under the control of the potential of the first pull-down node, to control the potential of the second gate driving signal to be the first level; and in the second maintenance sub-time period, the first gate driving output circuit outputs the second level, the potential of the first clock signal is the first level, the potential of the second clock signal is the second level, the first pull-node control circuit controls connection between the first pull-down node and the third voltage terminal under the control of the first clock signal to control the potential of the first pull-down node to be the first level, and the pull-down circuit controls connection between the second gate driving signal output terminal and the second voltage terminal under the control of the potential of the first pull-down node, to control the potential of the second gate driving signal to be the first level.

In a third aspect, a gate driving circuit includes a plurality of stages of shift register units.

In a fourth aspect, a display device includes the gate driving circuit.

DETAILED DESCRIPTION

The technical solutions in the embodiments of the present disclosure will be described clearly and completely with reference to the drawings in the embodiments of the present disclosure, and it is obvious that the embodiments described are only some embodiments of the present disclosure, rather than all embodiments. All other embodiments, which can be derived by a person skilled in the art from the embodiments disclosed herein without making any creative effort, shall fall within the protection scope of the present disclosure.

The transistors used in all embodiments of the present disclosure may be transistors, thin film transistors, or field effect transistors or other devices with the same characteristics. In the embodiments of the present disclosure, to distinguish two electrodes of a transistor except for a control electrode, one electrode is referred to as a first electrode, and the other electrode is referred to as a second electrode.

In practical operation, for a transistor, the control electrode may be a base electrode, the first electrode may be a collector electrode, and the second electrode may be an emitter electrode. Alternatively, the control electrode may be a base electrode, the first electrode may be an emitter electrode, and the second electrode may be a collector electrode.

In practical operation, when the transistor is a thin film transistor or a field effect transistor, the control electrode may be a gate electrode, the first electrode may be a drain electrode, and the second electrode may be a source electrode. Alternatively, the control electrode may be a gate electrode, the first electrode may be a source electrode, and the second electrode may be a drain electrode.

A shift register unit according to at least one embodiment of the present disclosure includes a first gate driving output circuit and a second gate driving output circuit. The first gate driving output circuit is used to output a first gate driving signal through a first gate driving signal output terminal. The second gate driving output circuit is used to generate a second gate driving signal outputted simultaneously with the first gate driving signal based on the first gate driving signal, a first clock signal, and a second clock signal.

In at least one embodiment of the present disclosure, the second gate driving signal may be inverted to the first gate driving signal, but not limited thereto.

The shift register unit according to at least one embodiment of the present disclosure generates the inverted second gate driving by adding a second gate driving output circuit, using the first gate driving signal, the first clock signal, and the second clock signal, so that positive and negative switching control signals required by the LTPO pixel may be generated by one stage of shift register unit.

Figure 1A:
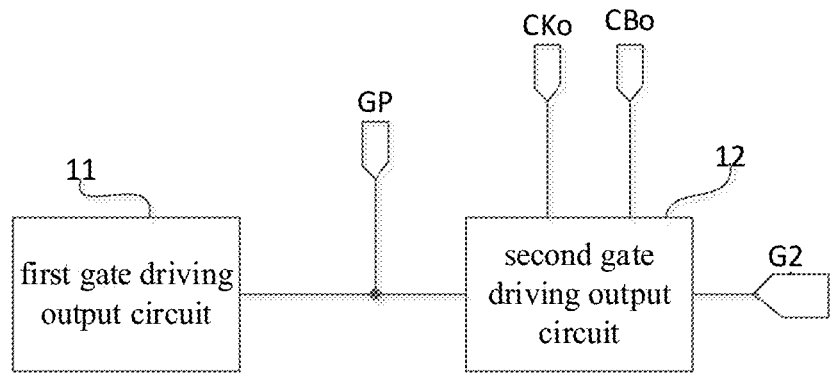
FIG. 1A is a structural diagram of a shift register unit according to at least one embodiment of the present disclosure.

As shown in FIG. 1A, the shift register unit according to at least one embodiment of the present disclosure includes a first gate driving output circuit 11 and a second gate driving output circuit 12. The first gate driving output circuit 11 is used to output the first gate driving signal through the first gate driving signal output terminal GP. The second gate driving output circuit 12 is electrically connected to a first clock signal terminal, a second clock signal terminal, a first gate driving signal output terminal GP and a second gate driving signal output terminal G2, respectively, and configured to generate the second gate driving signal based on the first gate driving signal, the first clock signal CKo and the second clock signal CBo, and output the second gate driving signal through the second gate driving signal output terminal G2 signal. The first clock signal terminal is used to input the first clock signal CKo, and the second clock signal terminal is used to input a second clock signal CBo.

In the embodiment shown in FIG. 1A, a third clock signal CK and a fourth clock signal CB may be applied to the first gate driving output circuit 11. In a specific implementation, CKo can be the same as CK, and CBo can be the same as CB, but not limited to this. In an actual operation, CKo can also be different from CK, CBo can also be different from CB.

In the embodiment shown in FIG. 1A, the second gate driving output circuit 12 may also be electrically connected to a power supply voltage terminal and a low voltage terminal.

When the shift register unit shown in FIG. 1A of the present disclosure is in operation, the following is implemented.

In an output phase, the first gate driving output circuit 11 outputs a first level through the GP; the potential of the first clock signal CKo is a second level, the potential of the second clock signal CBo is the first level, the second gate driving output circuit 12 controls the potential of the second gate driving signal to the second level under the control of the first gate driving signal.

In a reset phase, the first gate driving output circuit 11 outputs a second level through the GP, the potential of the first clock signal CKo is the first level, the potential of the second clock signal CBo is the second level, and the second gate driving output circuit 12 controls the potential of the second gate driving signal CBo to the first level under the control of the first clock signal CKo.

In an output cut-off maintenance phase, the first gate driving output circuit 11 outputs the second level through the GP, and the second gate driving output circuit 12 controls the potential of the second gate driving signal to be the first level under the control of the first clock signal CKo and the second clock signal CBo.

In at least one embodiment of the present disclosure, the outputting the second gate driving signal and the first gate driving signal simultaneously refers to that, in the output phase, the first gate driving output circuit 11 controls the potential of the first gate driving the signal to be the first level, and the second gate driving output circuit 12 controls the potential of the second gate driving signal to be the second level, but not limited to this.

In at least one embodiment of the present disclosure, the first level may be a low level, and the second level may be a high level, but not limited to this.

In a specific implementation, the first level may also be a high level, and the second level may be a low level.

Figure 1B:
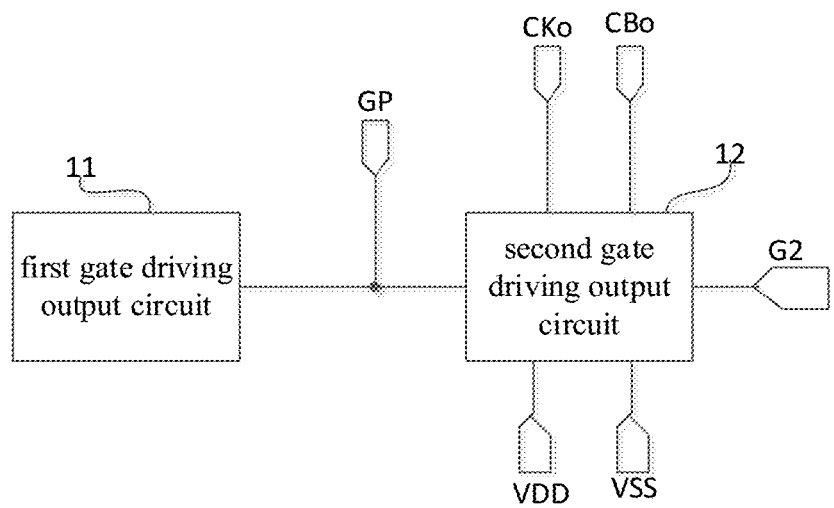
FIG. 1B is a structural diagram of a shift register unit according to at least one embodiment of the present disclosure.

As shown in FIG. 1B, on the basis of the shift register unit shown in FIG. 1A, the second gate driving output circuit 12 may be also connected to a power supply voltage VDD and a first low voltage VSS.

Figure 1C:
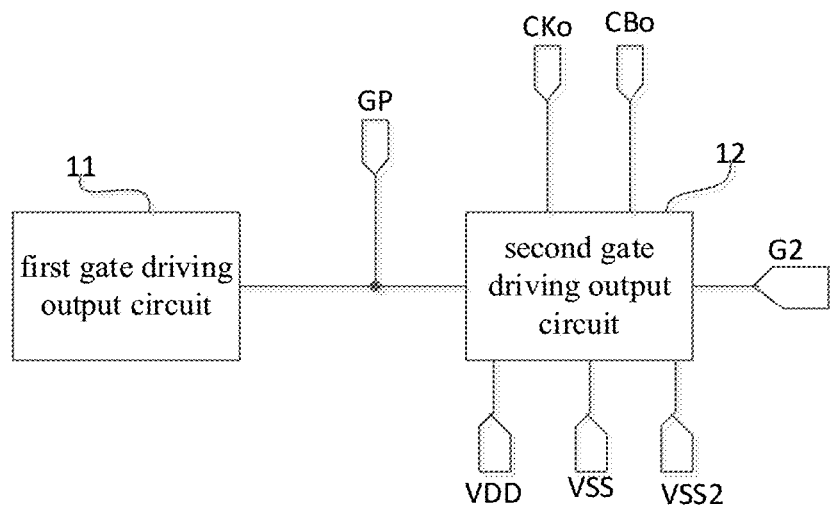
FIG. 1C is a structural diagram of a shift register unit according to at least one embodiment of the present disclosure.

As shown in FIG. 1C, on the basis of the shift register unit shown in FIG. 1A, the second gate driving output circuit 12 may also be connected to the power supply voltage VDD, the first low voltage VSS, and a second low Voltage VSS2.

Specifically, the second gate driving circuit may include a first pull-down node control circuit, a pull-down circuit and an output control circuit.

The output control circuit is used to control the connection or disconnection between the second gate driving signal output terminal and the first voltage terminal under the control of the first gate driving signal.

The first pull-down node control circuit is used to control the potential of the first pull-down node under the control of the first gate driving signal, the first clock signal, and the second clock signal.

The pull-down circuit is used to control the connection or disconnection between the output terminal of the second gate driving signal and the second voltage terminal under the control of the potential of the first pull-down node.

In a specific implementation, the second gate driving circuit may include a first pull-down node control circuit, a pull-down circuit, and an output control circuit. The output control circuit controls the second gate driving under the control of the first gate driving signal, the first pull-down node control circuit is used to control the potential of the first pull-down node, and the pull-down circuit controls whether the second gate driving signal is connected to the second voltage terminal under the control of the potential of the first pull-down node.

In at least one embodiment of the present disclosure, the first voltage terminal may be a power voltage terminal, and the second voltage terminal may be a first low voltage terminal, but not limited thereto.

In specific implementation, the first pull-down node control circuit may be connected to the first gate driving signal output terminal, the first clock signal terminal, the second clock signal terminal, the first pull-down node, the first voltage terminal and the third voltage terminal, and is used to control the connection or disconnection between the first pull-down node and the first voltage terminal under the control of the first gate driving signal, control the connection or disconnection between the first pull-down node and the third voltage terminal under the control of the first clock signal, and control the potential of the first pull-down node based on the second clock signal.

In at least one embodiment of the present disclosure, the third voltage terminal may be the first low voltage terminal or the second low voltage terminal, but not limited thereto.

In at least one embodiment of the present disclosure, the first voltage terminal may be a power voltage terminal, but not limited thereto.

In at least one embodiment of the present disclosure, the first pull-down node control circuit can also be used to control the potential of the first pull-down node based on the second gate driving signal, and control the potential of the first pull-down node to be the first level based on the second gate driving signal in the output cut-off maintenance phase, so that the second gate driving signal can be maintained at the first level in a better manner.

Figure 2:
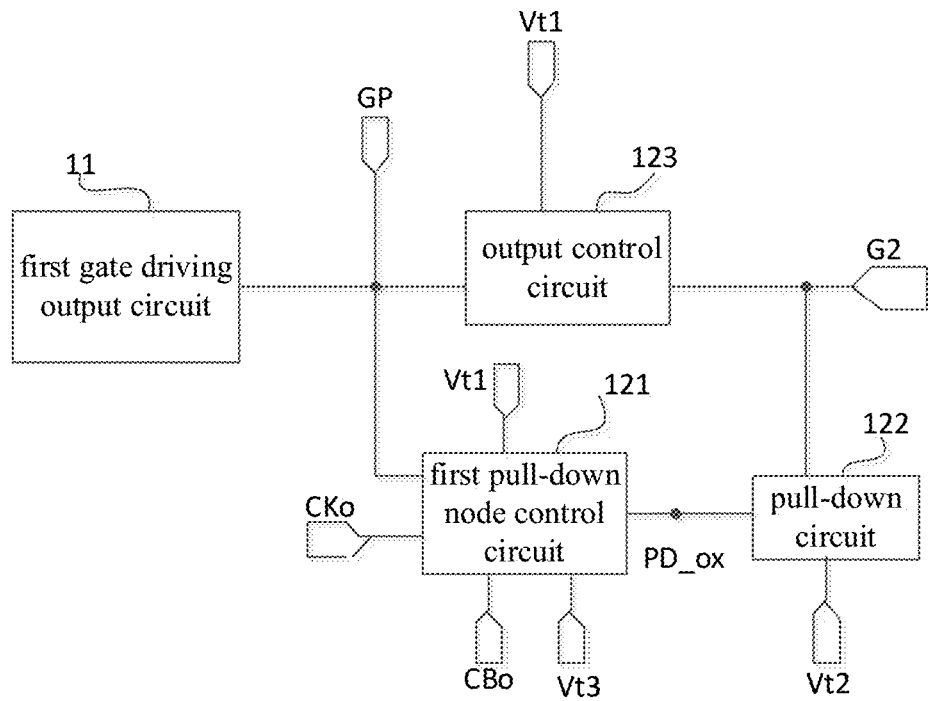
FIG. 2 is a structural diagram of a shift register unit according to at least one embodiment of the present disclosure.

As shown in FIG. 2, based on the shift register unit shown in FIG. 1A, the second gate driving circuit includes a first pull-down node control circuit 121, a pull-down circuit 122, and an output control circuit 123.

The output control circuit 123 is electrically connected to the first gate driving signal output terminal GP, the second gate driving signal output terminal G2, and the first voltage terminal Vt1, respectively, is configured to control the connection and disconnection between the second gate driving signal output terminal G2 and the first voltage terminal Vt1 under the control of the first gate driving signal.

The first pull-down node control circuit 121 is electrically connected to the first gate driving signal output terminal GP, the first clock signal terminal, the second clock signal terminal, the first pull-down node PD_ox, the first voltage terminal Vt1 and the third voltage terminal Vt3, and configured to control the connection or disconnection between the first pull-down node PD_ox and the first voltage terminal Vt1 under the control of the first gate driving signal, and control the connection or disconnection between the first pull-down node PD_ox and the third voltage terminal Vt3 under the control of the first clock signal CKo, and control the potential of the first pull-down node PD_ox based on the second clock signal CBo.

The pull-down circuit 122 is electrically connected to the first pull-down node PD_ox, the second gate driving signal output terminal G2 and the second voltage terminal Vt2, respectively, is configured to control the connection or disconnection between the second gate driving signal output terminal G2 and the second voltage terminal Vt2 under the control of the potential of the first pull-down node PD_ox.

In the embodiment shown in FIG. 2, the first voltage terminal may be the power voltage terminal, and both the second voltage terminal and the third voltage terminal may be first low voltage terminals; or, the first voltage terminal may be the power voltage terminal, the second voltage terminal may be the first low voltage terminal, and the third voltage terminal may be the second low voltage terminal; but not limited to this.

When both the transistor included in the first pull-down node control circuit and the pull-down transistor included in the pull-down circuit are p-type transistors, the third voltage is less than the second voltage, so that the pull-down transistor can be turned on in a better manner in the output cut-off maintenance phase, to ensure that the first level is output at the fastest speed through the second gate driving signal output terminal.

Alternatively, when the transistors included in the first pull-down node control circuit and the pull-down transistors included in the pull-down circuit are both n-type transistors, the third voltage is greater than the second voltage, so that the pull-down transistor can be turned on in a better manner in the output cut-off maintenance phase, to ensure that the first level is output at the fastest speed through the second gate driving signal output terminal.

In a specific implementation, the second gate driving circuit 12 may include a first pull-down node control circuit 121, a pull-down circuit 122, and an output control circuit 123. The output cut-off maintenance phase may include a plurality of maintenance time periods set in sequence. The maintenance time period may include a first maintenance sub-time period and a second maintenance sub-time period set in sequence.

During the first maintenance sub-period, the first gate driving output circuit 11 outputs a second level, the potential of the first clock signal CKo is the second level, and the potential of the second clock signal CBo is the first level. The first pull-down node control circuit 121 maintains the potential of the first pull-down node PD_ox to be the first level under the control of the second clock signal CBo, and the pull-down circuit 122 controls the connection between the second gate driving signal output terminal G2 and the first low voltage terminal under the control of the potential of the first pull-down node PD_ox, so as to control the potential of the second gate driving signal to be the first level (in the shift register unit shown in FIG. 2 of the present disclosure, the first level is a low voltage and the second level is a high voltage, but not limited to this).

During the second maintenance sub-period, the first gate driving output circuit 11 outputs a second level, the potential of the first clock signal CKo is the first level, and the potential of the second clock signal CBo is the second level. The first pull-down node control circuit 121 controls the connection between the first pull-down node PD_ox and the first low voltage terminal under the control of the first clock signal CKo, so as to control the potential of the first pull-down node PD_ox to be the first level, the pull-down circuit 122 controls the connection between the second gate driving signal output terminal G2 and the first low voltage terminal under the control of the potential of the first pull-down node PD_ox, so as to control the potential of the second gate driving signal to be the first level.

In an implementation, the first pull-down node control circuit 121 can also control the potential of the first pull-down node PD_ox based on the second gate driving signal.

When the shift register unit as shown in FIG. 2 is in operation, the following is implemented.

In the output cut-off maintenance phase, the second gate driving signal output by G2 is at a low level, so that the first pull-down node control circuit 121 controls to pull down the potential of PD_ox based on the second gate driving signal, so that the pull-down circuit 122 can control G2 to output a low level under the control of the potential of PD_ox in a better manner.

Specifically, the first pull-down node control circuit may include a first pull-down node control transistor, a second pull-down node control transistor, and a first pull-down node control capacitor.

A control electrode of the first pull-down node control transistor is electrically connected to the first gate driving signal output terminal, and a first electrode of the first pull-down node control transistor is electrically connected to the first voltage terminal, and a second electrode of the first pull-down node control transistor is electrically connected to the first pull-down node.

A control electrode of the second pull-down node control transistor is electrically connected to the first clock signal terminal, a first electrode of the second pull-down node control transistor is electrically connected to the first pull-down node, and the second electrode of the second pull-down node control transistor is electrically connected to the third voltage terminal.

A first terminal of the first pull-down node control capacitor is electrically connected to the first pull-down node, and a second terminal of the first pull-down node control capacitor is electrically connected to the second clock signal terminal.

Figure 3:
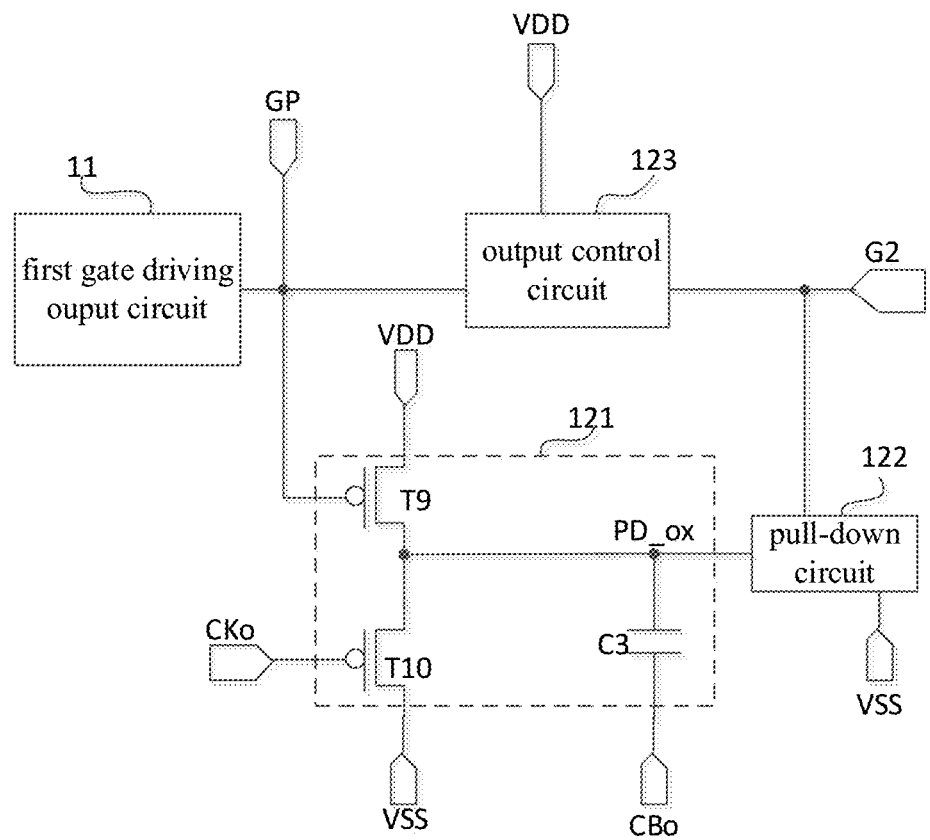
FIG. 3 is a structural diagram of a shift register unit according to at least one embodiment of the present disclosure.

As shown in FIG. 3, based on the embodiment of the shift register unit shown in FIG. 2, the first pull-down node control circuit 121 may include a first pull-down node control transistor T9 and a second pull-down node control transistor T10 and the first pull-down node control capacitor C3.

A gate electrode of the first pull-down node control transistor T9 is electrically connected to the first gate driving signal output terminal GP, a drain electrode of the first pull-down node control transistor T9 is electrically connected to the power supply voltage terminal, a source electrode of the first pull-down node control transistor T9 is electrically connected to the first pull-down node PD_ox; the power supply voltage terminal is used to input the power supply voltage VDD.

A gate electrode of the second pull-down node control transistor T10 is electrically connected to the first clock signal terminal, a drain electrode of the second pull-down node control transistor T10 is electrically connected to the first pull-down node PD_ox, and a source electrode of the second pull-down node control transistor T10 is electrically connected to the first low voltage terminal; the first low voltage terminal is used to input a first low voltage VSS; the first clock signal terminal is used to input a first clock signal CKo.

A first terminal of the first pull-down node control capacitor C3 is electrically connected to the first pull-down node PD_ox, and a second terminal of the first pull-down node control capacitor C3 is electrically connected to the second clock signal terminal; the second clock signal terminal is used to input the second clock signal CBo.

In the embodiment shown in FIG. 3, the first voltage terminal is the power supply voltage terminal, and both the second voltage terminal and the third voltage terminal are first low voltage terminals, but not limited thereto.

In the embodiment shown in FIGS. 3, T9 and T10 may both be P-type thin film transistors, but not limited to this.

In an actual operation, the source electrode of T10 can also be connected to the second lowest voltage, but not limited to this.

In an implementation, the first pull-down node control circuit may further include a second pull-down node control capacitor.

A first terminal of the second pull-down node control capacitor is electrically connected to the first pull-down node, and a second terminal of the second pull-down node control capacitor is electrically connected to the second gate driving signal output terminal.

Figure 4:
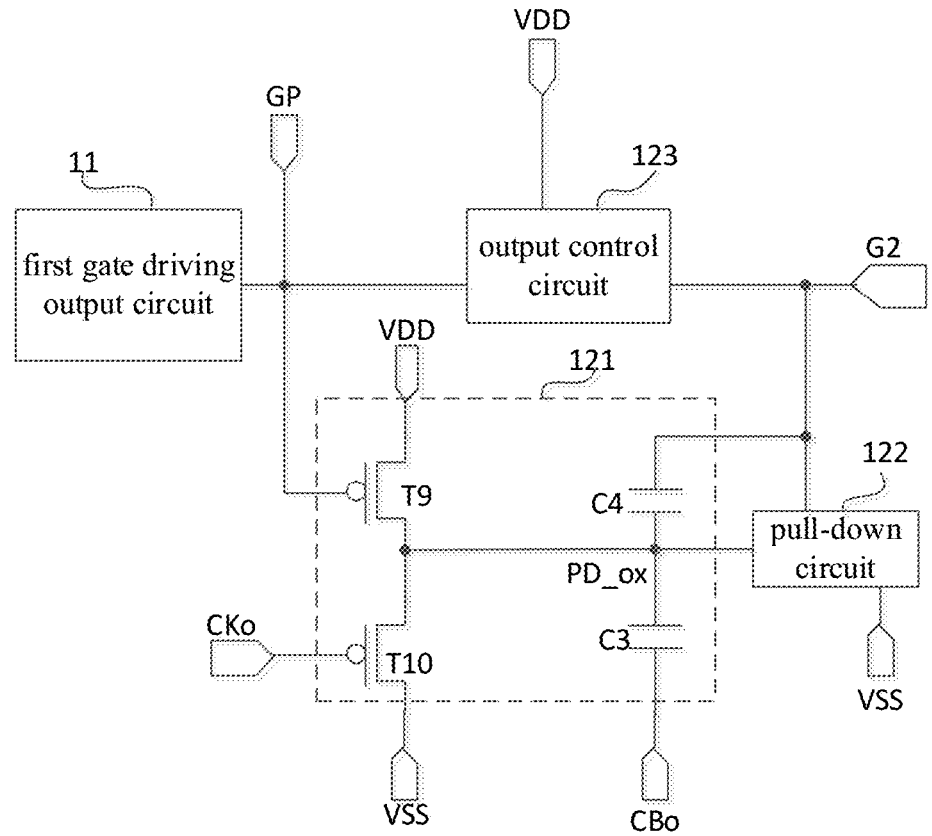
FIG. 4 is a structural diagram of a shift register unit according to at least one embodiment of the present disclosure.

As shown in FIG. 4, on the basis of the shift register unit shown in FIG. 3, the first pull-down node control circuit 121 may further include a second pull-down node control capacitor C4.

The first terminal of the second pull-down node control capacitor C4 is electrically connected to the first pull-down node PD_ox, and the second end of the second pull-down node control capacitor C4 is electrically connected to the second gate driving signal output terminal G2.

In the embodiment shown in FIG. 4, the second voltage terminal is the first low voltage terminal, but not limited to this.

Specifically, the output control circuit may include an output control transistor. A control electrode of the output control transistor is electrically connected to the first gate driving signal output terminal, a first electrode of the output control transistor is electrically connected to the first voltage terminal, and a second electrode of the output control transistor is electrically connected to the second gate driving signal output terminal.

Specifically, the pull-down circuit may include a pull-down transistor; a control electrode of the pull-down transistor is electrically connected to the first pull-down node, a first electrode of the pull-down transistor is electrically connected to the second gate driving signal output terminal, and a second electrode of the pull-down transistor is connected to the second voltage terminal.

In a specific implementation, the first gate driving output circuit is used to control to output the first gate driving signal under the control of the third clock signal and the fourth clock signal.

The first pull-down node control circuit includes a first pull-down node control transistor, a second pull-down node control transistor, a first pull-down node control capacitor, and a second pull-down node control capacitor, and the pull-down circuit includes a pull-down transistor.

A control electrode of the first pull-down node control transistor is electrically connected to the first gate driving signal output terminal, and a first electrode of the first pull-down node control transistor is electrically connected to the first voltage terminal, and a second electrode of the first pull-down node control transistor is electrically connected to the first pull-down node.

A control electrode of the second pull-down node control transistor is electrically connected to the first clock signal terminal, a first electrode of the second pull-down node control transistor is electrically connected to the first pull-down node, and the second electrode of the second pull-down node control transistor is electrically connected to the third voltage terminal.

A first end of the first pull-down node control capacitor is electrically connected to the first pull-down node, and a second end of the first pull-down node control capacitor is electrically connected to the second clock signal terminal.

A first end of the second pull-down node control capacitor is electrically connected to the first pull-down node, and a second end of the second pull-down node control capacitor is connected to the second gate driving signal output terminal.

A control electrode of the pull-down transistor is electrically connected to the first pull-down node, a first electrode of the pull-down transistor is electrically connected to the second gate driving signal output terminal, and a second electrode of the pull-down transistor is electrically connected to the second voltage terminal.

Specifically, the second voltage terminal is used to input a second voltage, and the third voltage terminal is used to input a third voltage. The third voltage is less than the second voltage.

In a specific implementation, the second voltage terminal may be a first low voltage terminal, and the third voltage terminal may be a second low voltage terminal, but not limited thereto. The first low voltage terminal is used to input a first low voltage, and the second low voltage terminal is used to input a second low voltage.

In at least one embodiment of the present disclosure, when the first clock signal is different from the third clock signal, the second clock signal is different from the fourth clock signal, and the transistor included in the first pull-down node control circuit and the pull-down transistors included in the pull-down circuit are all p-type transistors, the second low voltage can be smaller than the first low voltage, so that the potential of the first pull-down node can be pulled down lower in the output cut-off maintenance phase, thereby ensuring the second gate driving signal output terminal outputs the low voltage at the fastest speed.

In at least one embodiment of the present disclosure, when both the transistor included in the first pull-down node control circuit and the pull-down transistor included in the pull-down circuit are n-type transistors, the third voltage may be greater than the second voltage, so that the pull-down transistor can be turned on in a better manner in the output cut-off maintenance phase, so as to ensure that the first level is output at the fastest speed through the second gate driving signal output terminal.

In at least one embodiment of the present disclosure, the first gate driving output circuit may include a pull-up node control circuit, a pull-down input node control circuit, a second pull-down node control circuit, and an output circuit.

The pull-up node control circuit is used to control the potential of the pull-up node under the control of the third clock signal and the potential of the pull-down input node, and to maintain the potential of the pull-up node.

The pull-down input node control circuit is used to control the connection or disconnection between the input terminal and the pull-down input node under the control of the third clock signal, and control the connection between the pull-down input node and the fourth voltage terminal under the control of the potential of the pull-up node and the fourth clock signal.

The second pull-down node control circuit is used to control the connection or disconnection between the pull-down input node and the second pull-down node under the control of the fifth voltage signal, and to maintain the potential of the second pull-down node.

The output circuit is used to control the first gate driving signal output terminal to output the first gate driving signal based on the fourth clock signal under the control of the potential of the pull-up node and the potential of the second pull-down node.

In a specific implementation, the fourth voltage terminal is used to input a fourth voltage, and the fourth voltage terminal may be the power supply voltage terminal, but not limited thereto.

In specific implementation, the fifth voltage signal may be a low voltage signal, but not limited to this.

According to a specific embodiment, the first clock signal may be the same as the third clock signal, and the second clock signal may be the same as the third clock signal.

According to another specific embodiment, the first clock signal may be different from the third clock signal, and the second clock signal may be different from the third clock signal.

Figure 5:
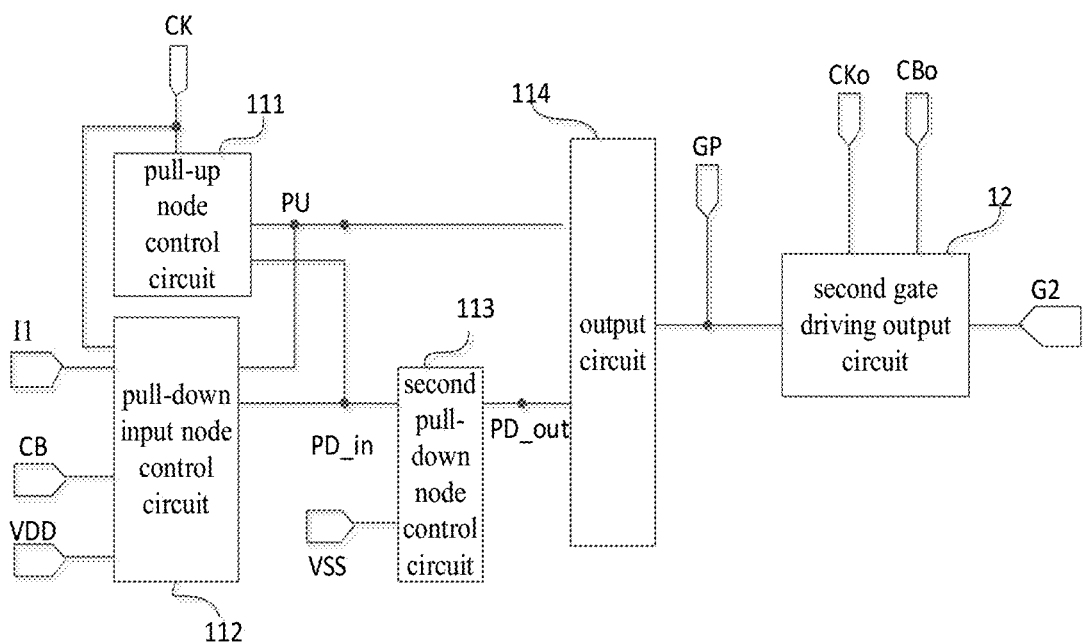
FIG. 5 is a structural diagram of a shift register unit according to at least one embodiment of the present disclosure.

As shown in FIG. 5, on the basis of the shift register unit shown in FIG. 1A, the first gate driving output circuit may include a pull-up node control circuit 111, a pull-down input node control circuit 112, a second pull-down node control circuit 113 and an output circuit 114.

The pull-up node control circuit 111 is electrically connected to the third clock signal terminal, the pull-down input node PD_in and the pull-up node PU, respectively, is configured to control the potential of the pull-up node PU under the control of the third clock signal CK and the potential of the pull-down input node PD_in, and maintain the potential of the pull-up node PU; the third clock signal terminal is used to input a third clock signal CK.

The pull-down input node control circuit 112 is electrically connected to the third clock signal terminal, the fourth clock signal terminal, the pull-down input node PD_in, an input terminal I1, the pull-up node PU, and the power supply voltage terminal, respectively, and configured to control the connection or disconnection between the input terminal I1 and the pull-down input node PD_in under the control of the third clock signal CK, and control the connection or disconnection between the pull-down input node PD_in and the power voltage terminal under the control of the potential of the pull-up node PU and the fourth clock signal CB; the fourth clock signal terminal is used to input the fourth clock signal CB; the power voltage terminal is used to input the power voltage VDD.

The second pull-down node control circuit 113 is electrically connected to the first low voltage terminal, the pull-down input node PD_in and the second pull-down node PD_out, respectively, and is configured to control the connection or disconnection between the pull-down input node PD_in and the second pull-down node PD_out under the control of the first low voltage VSS, and maintain the potential of the second pull-down node PD_out; the first low voltage terminal is used to input the first low voltage VSS.

The output circuit 114 is electrically connected to the pull-up node PU, the second pull-down node PD_out, the fourth clock signal terminal and the first gate driving signal output terminal GP, and is configured to control the first gate driving signal output terminal GP to output the first gate driving signal based on the fourth clock signal CB under the control of the potential of the pull-up node PU and the potential of the second pull-down node PD_out; the fourth clock signal terminal is used to input the fourth clock signal CB.

Figure 6:
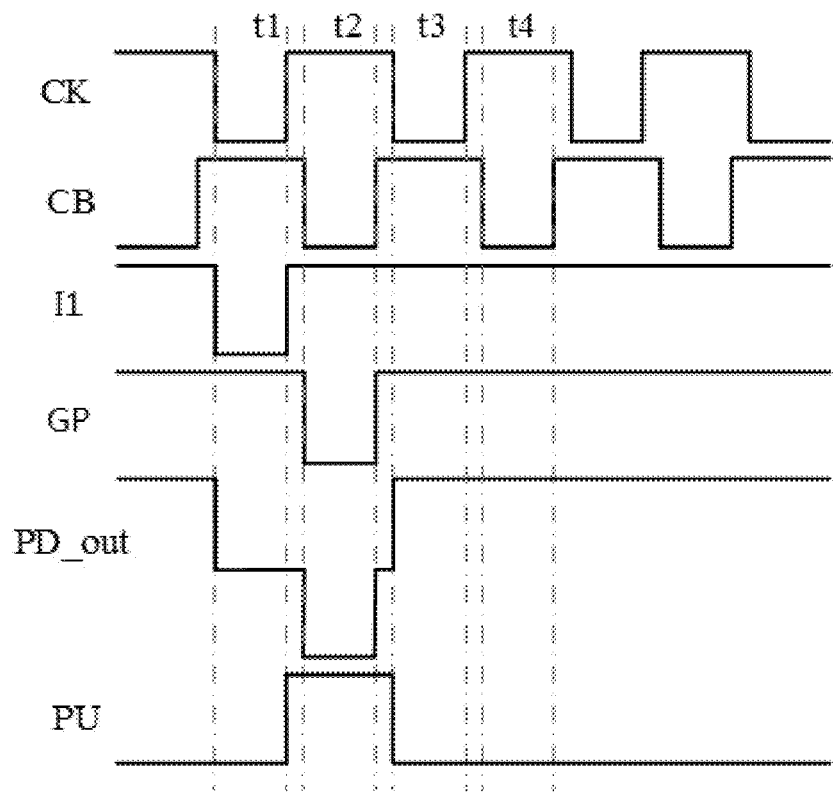
FIG. 6 is an operation timing diagram of the shift register unit shown in FIG. 5 according to at least one embodiment of the present disclosure.

When at least one embodiment of the shift register unit shown in FIG. 5 of the present disclosure is in operation, when the transistors included in the first gate driving output circuit 11 are all p-type transistors, as shown in FIG. 6, the following is implemented.

In the input phase t1, I1 inputs a low level, CK is a low level, and CB is a high level, the pull-up node control circuit 111 controls the potential of the PU to a low level; the pull-down input node control circuit 112 control the connection between PD_in and I1 under the control of CK, thereby controlling the potential of PD_in to be a low level, the second pull-down node control circuit 113 controls the connection between PD_in and the second pull-down node PD_out, the potential of PD_out is a low level. The output circuit 114 controls the GP to receive the CB under the control of the potential of PD_out, and controls the GP to receive VDD under the control of the potential of the PU, thereby outputting a high level through the GP.

In the output phase t2, I1 inputs a high level, CK is a high level, and CB is a low level, the pull-down input node control circuit 112 controls the disconnection between PD_in and I1 under the control of CK, thereby maintaining the potential of PD_in to be a low level, the pull-up node control circuit 111 controls the PU to receive CK under the control of the potential of PD_in, thereby controlling the potential of PU to be a high level, and the pull-down input node control circuit 112 controls the disconnection between the PD_in and the power supply voltage terminal under the control of the potential of PU; the output circuit 114 controls the GP to receive the CB under the control of the potential of PD_out, so as to control the first gate driving signal outputted by the GP to change from a high level to a low level, the second pull-down node control circuit 113 further pulls down the potential of PD_out based on the first gate driving signal.

In the reset phase t3, I1 inputs a high level, CK is a low level, and CB is a high level, the pull-up node control circuit 111 controls the PU to receive VSS under the control of CK, and the output circuit 114 controls the GP to receive VDD under the control of the potential of the PU, to output VDD through the GP; the pull-down input node control circuit 112 controls the connection between PD_in and I1 under the control of CK, thereby controlling the potential of PD_in to be a high level; the second pull-down node control circuit 113 controls the connection between PD_in and PD_out, thereby controlling the potential of PD_out to be a high level.

In the first maintenance sub-time period t4, I1 inputs a high level, CK is a high level, and CB is a low level, the pull-up node control circuit 111 maintains the potential of PU at a low level, and the pull-down input node control circuit 112 controls and maintains the potential of PD_in at a high level. The second pull-down node control circuit 113 controls the connection between PD_in and PD_out, thereby controlling the potential of PD_out at a high level; the output circuit 114 controls the GP to receive VDD under the control of the potential of the PU, so as to output VDD through the GP.

Specifically, the pull-up node control circuit may include a first pull-up node control transistor, a second pull-up node control transistor, and a pull-up node control capacitor.

A control electrode of the first pull-up node control transistor is electrically connected to the third clock signal terminal, a first electrode of the first pull-up node control transistor is electrically connected to a sixth voltage terminal, and a second electrode of first pull-up node control transistor is electrically connected to the pull-up node.

A control electrode of the second pull-up node control transistor is electrically connected to the pull-down input node, a first electrode of the second pull-up node control transistor is electrically connected to the pull-up node, and a second electrode of the second pull-up node control transistor is electrically connected to the third clock signal terminal.

A first end of the pull-up node control capacitor is electrically connected to the pull-up node, and a second end of the pull-up node control capacitor is electrically connected to a seventh voltage terminal.

In specific implementation, the sixth voltage terminal may be the first low voltage terminal, but not limited thereto.

Specifically, the pull-down input node control circuit may include a first pull-down input node control transistor, a second pull-down input node control transistor, and a third pull-down input node control transistor.

A control electrode of the first pull-down input node control transistor is electrically connected to the third clock signal terminal, a first electrode of the first pull-down input node control transistor is electrically connected to the input terminal, and a second electrode of the first pull-down input node control transistor is electrically connected to the pull-down input node.

A control electrode of the second pull-down input node control transistor is electrically connected to the pull-up node, and a first electrode of the second pull-down input node control transistor is electrically connected to the fourth voltage terminal.

A control electrode of the third pull-down input node control transistor is electrically connected to the fourth clock signal terminal, and a first electrode of the third pull-down input node control transistor is electrically connected to the second electrode of the second pull-down input node control transistor, a second electrode of the third pull-down input node control transistor is electrically connected to the pull-down input node.

The second pull-down node control circuit may include a control transistor and a control capacitor.

A control electrode of the control transistor is electrically connected to the fifth voltage terminal, a first electrode of the control transistor is electrically connected to the pull-down input node, and a second electrode of the control transistor is electrically connected to the second pull-down node.

A first end of the control capacitor is electrically connected to the second pull-down node, and a second end of the control capacitor is electrically connected to the first gate driving signal output end.

The output circuit includes a first output transistor and a second output transistor.

A control electrode of the first output transistor is electrically connected to the pull-up node, a first electrode of the first output transistor is electrically connected to the seventh voltage terminal, and a second electrode of the first output transistor is electrically connected to the first gate driving signal output terminal.

A control electrode of the second output transistor is electrically connected to the second pull-down node, a first electrode of the second output transistor is electrically connected to the first gate driving signal output terminal, and a second electrode of the second output transistor is electrically connected to the fourth clock signal terminal.

In specific implementation, the fourth voltage terminal may be a power supply voltage terminal, but not limited to this.

In specific implementation, the fifth voltage terminal may be the first low voltage terminal, but not limited thereto.

In specific implementation, the seventh voltage terminal may be a power supply voltage terminal, but not limited to this.

Figure 7:
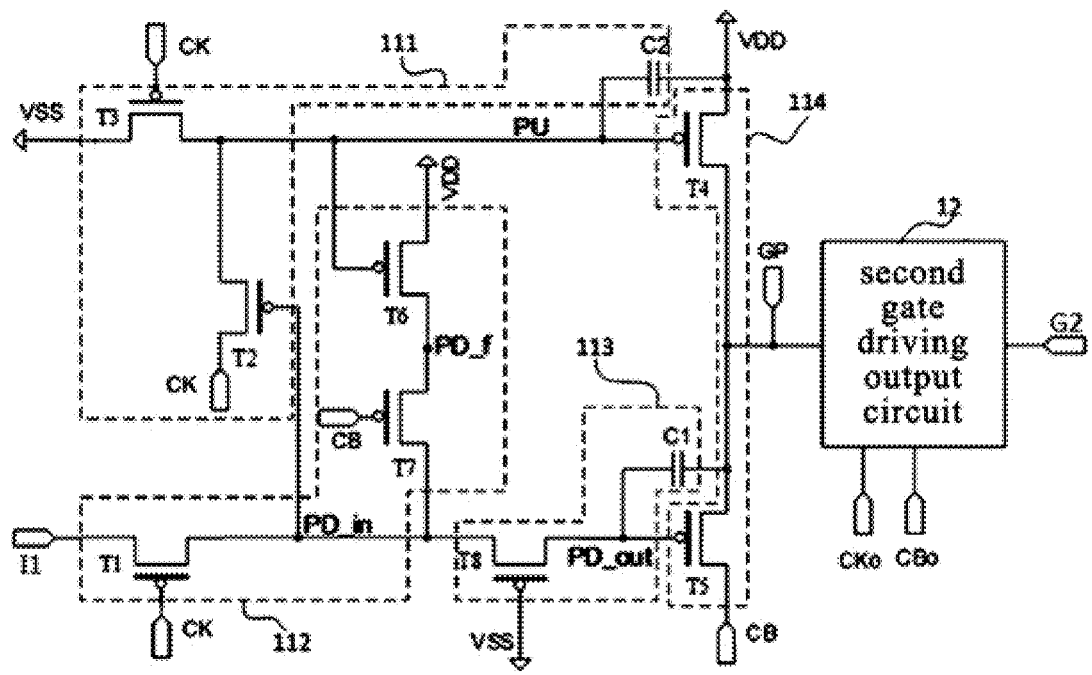
FIG. 7 is a circuit diagram of a shift register unit according to at least one embodiment of the present disclosure.

As shown in FIG. 7, on the basis of the embodiment of the shift register unit shown in FIG. 5, the pull-up node control circuit 111 includes a first pull-up node control transistor T3, a second pull-up node control transistor T2, and a pull-up node control capacitor C2.

A gate electrode of the first pull-up node control transistor T3 is electrically connected to the third clock signal terminal, a drain electrode of the first pull-up node control transistor T3 is electrically connected to the first low voltage terminal, and a source electrode of the first pull-up node control transistor T3 is electrically connected to the pull-up node PU.

A gate electrode of the second pull-up node control transistor T2 is electrically connected to the pull-down input node PD_in, a drain electrode of the second pull-up node control transistor T2 is electrically connected to the pull-up node PU, a source electrode of the second pull-up node control transistor T2 is electrically connected to the third clock signal terminal.

A first end of the pull-up node control capacitor C2 is electrically connected to the pull-up node PU, and a second end of the pull-up node control capacitor C2 is electrically connected to the first low voltage terminal.

The pull-down input node control circuit 112 includes a first pull-down input node control transistor T1, a second pull-down input node control transistor T6, and a third pull-down input node control transistor T7.

A gate electrode of the first pull-down input node control transistor T1 is electrically connected to the third clock signal terminal, a drain electrode of the first pull-down input node control transistor T1 is electrically connected to the input terminal I1, a source electrode of the first pull-down input node control transistor T1 is electrically connected to the pull-down input node PD_in.

A gate electrode of the second pull-down input node control transistor T6 is electrically connected to the pull-up node PU, and a drain electrode of the second pull-down input node control transistor T6 is electrically connected to the power supply voltage terminal.

A gate electrode of the third pull-down input node control transistor T7 is electrically connected to the fourth clock signal terminal, a drain electrode of the third pull-down input node control transistor T7 is connected to a source electrode of the second pull-down input node control transistor T6, a source electrode of the third pull-down input node control transistor T7 is electrically connected to the pull-down input node PD_in.

The second pull-down node control circuit 113 includes a control transistor T8 and a control capacitor C1.

A gate electrode of the control transistor T8 is electrically connected to the first low voltage terminal, a drain electrode of the control transistor T8 is electrically connected to the pull-down input node PD_in, and a source electrode of the control transistor T8 is electrically connected to the second pull-down node PD_out.

A first end of the control capacitor C1 is electrically connected to the second pull-down node PD_out, and a second end of the control capacitor C1 is electrically connected to the first gate driving signal output terminal GP.

The output circuit 114 includes a first output transistor T4 and a second output transistor T5.

A gate electrode of the first output transistor T4 is electrically connected to the pull-up node PU, a drain electrode of the first output transistor T4 is electrically connected to the power supply voltage terminal, and a source electrode of the first output transistor T4 is connected to the first gate driving signal output terminal GP.

A gate electrode of the second output transistor T5 is electrically connected to the second pull-down node PD_out, a drain electrode of the second output transistor T5 is electrically connected to the first gate driving signal output terminal GP, a source electrode of the second output transistor T5 is electrically connected to the fourth clock signal terminal.

The power supply voltage terminal is used to input a power supply voltage VDD, the first low voltage terminal is used to input a first low voltage VSS, the third clock signal terminal is used to input a third clock signal CK, and the fourth clock signal terminal is used to input the fourth clock signal CK.

In the embodiment shown in FIG. 7, PD_f is an intermediate node.

In the embodiment shown in FIG. 7, T1, T2, T3, T4, T5, T6, T7, and T8 are all P-type thin film transistors, but not limited thereto.

Figure 8:
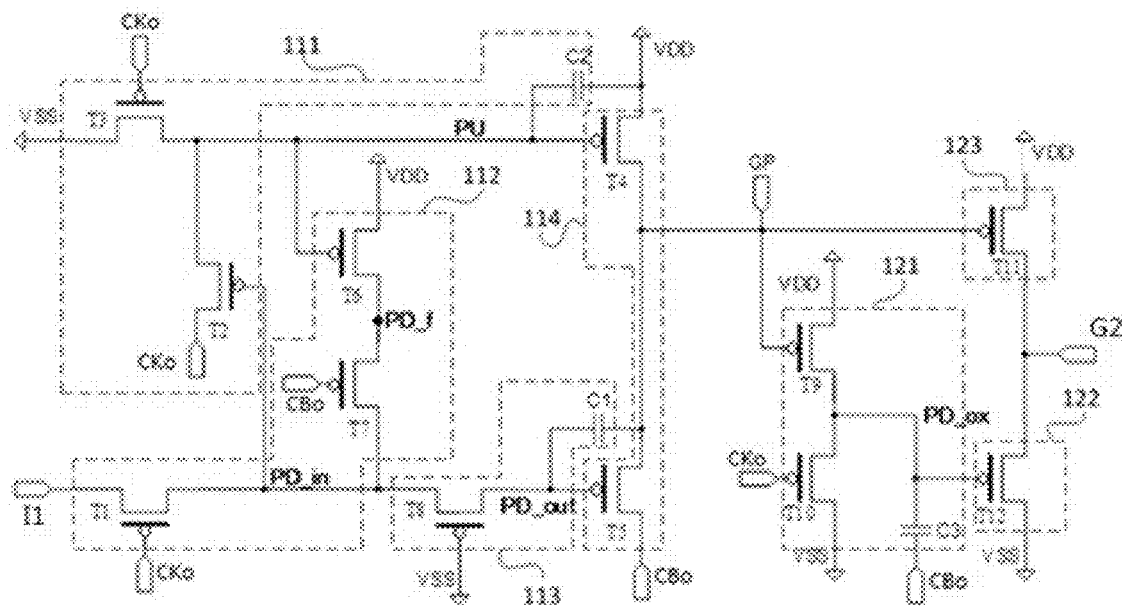
FIG. 8 is a circuit diagram of a shift register unit according to at least one embodiment of the present disclosure.

As shown in FIG. 8, the shift register unit according to at least one embodiment of the present disclosure includes a first gate driving output circuit and a second gate driving output circuit.

The second gate driving circuit includes a first pull-down node control circuit 121, a pull-down circuit 122, and an output control circuit 123.

The first pull-down node control circuit 121 includes a first pull-down node control transistor T9, a second pull-down node control transistor T10, and a first pull-down node control capacitor C3.

A gate electrode of the first pull-down node control transistor T9 is electrically connected to the first gate driving signal output terminal GP, a drain electrode of the first pull-down node control transistor T9 is electrically connected to the power supply voltage terminal, a source electrode of the first pull-down node control transistor T9 is electrically connected to the first pull-down node PD_ox; the power supply voltage terminal is used to input the power supply voltage VDD.

A gate electrode of the second pull-down node control transistor T10 is electrically connected to the first clock signal terminal, a drain electrode of the second pull-down node control transistor T10 is electrically connected to the first pull-down node PD_ox, and a source electrode of the second pull-down node control transistor T10 is electrically connected to the first low voltage terminal; the first low voltage terminal is used to input a first low voltage VSS; the first clock signal terminal is used to input a first clock signal CKo.

A first end of the first pull-down node control capacitor C3 is electrically connected to the first pull-down node PD_ox, and a second end of the first pull-down node control capacitor C3 is electrically connected to the second clock signal terminal; the second clock signal terminal is used to input a second clock signal CBo.

The pull-down circuit 122 includes a pull-down transistor T12. A gate electrode of the pull-down transistor T12 is electrically connected to the first pull-down node PD_ox, a drain electrode of the pull-down transistor T12 is electrically connected to the second gate driving signal output terminal G2, and a source electrode of the pull-down transistor T12 is electrically connected to the first low voltage end.

The output control circuit 123 includes an output control transistor T11. A gate electrode of the output control transistor T11 is electrically connected to the first gate driving signal output terminal GP, a drain electrode of the output control transistor T11 is electrically connected to the power supply voltage terminal, and a source electrode of the output control transistor T11 is connected to the second gate driving signal output terminal G2.

The first gate driving output circuit includes a pull-up node control circuit 111, a pull-down input node control circuit 112, a second pull-down node control circuit 113, and an output circuit 114.

The pull-up node control circuit 111 includes a first pull-up node control transistor T3, a second pull-up node control transistor T2, and a pull-up node control capacitor C2.

A gate electrode of the first pull-up node control transistor T3 is electrically connected to the first clock signal terminal, a drain electrode of the first pull-up node control transistor T3 is electrically connected to the first low voltage terminal, and a source electrode of the first pull-up node control transistor T3 is electrically connected to the pull-up node PU.

A gate electrode of the second pull-up node control transistor T2 is electrically connected to the pull-down input node PD_in, a drain electrode of the second pull-up node control transistor T2 is electrically connected to the pull-up node PU, a source electrode of the second pull-up node control transistor T2 is electrically connected to the third clock signal terminal.

A first end of the pull-up node control capacitor C2 is electrically connected to the pull-up node PU, and a second end of the pull-up node control capacitor C2 is electrically connected to the first low voltage terminal.

The pull-down input node control circuit 112 includes a first pull-down input node control transistor T1, a second pull-down input node control transistor T6, and a third pull-down input node control transistor T7.

A gate electrode of the first pull-down input node control transistor T1 is electrically connected to the first clock signal terminal, a drain electrode of the first pull-down input node control transistor T1 is electrically connected to the input terminal I1, a source electrode of the first pull-down input node control transistor T1 is electrically connected to the pull-down input node PD_in.

A gate electrode of the second pull-down input node control transistor T6 is electrically connected to the pull-up node PU, and a drain electrode of the second pull-down input node control transistor T6 is electrically connected to the power supply voltage terminal.

A gate electrode of the third pull-down input node control transistor T7 is electrically connected to the second clock signal terminal, a drain electrode of the third pull-down input node control transistor T7 is connected to the source electrode of the second pull-down input node control transistor T6, a source electrode of the third pull-down input node control transistor T7 is electrically connected to the pull-down input node PD_in.

The second pull-down node control circuit 113 includes a control transistor T8 and a control capacitor C1.

A gate electrode of the control transistor T8 is electrically connected to the first low voltage terminal, a drain electrode of the control transistor T8 is electrically connected to the pull-down input node PD_in, and a source electrode of the control transistor T8 is connected to the second pull-down node PD_out.

A first end of the control capacitor C1 is electrically connected to the second pull-down node PD_out, and a second end of the control capacitor C1 is electrically connected to the first gate driving signal output terminal GP.

The output circuit 114 includes a first output transistor T4 and a second output transistor T5.

A gate electrode of the first output transistor T4 is electrically connected to the pull-up node PU, a drain electrode of the first output transistor T4 is electrically connected to the power supply voltage terminal, and a source electrode of the first output transistor T4 is connected to the first gate driving signal output terminal GP.

A gate electrode of the second output transistor T5 is electrically connected to the second pull-down node PD_out, a drain electrode of the second output transistor T5 is electrically connected to the first gate driving signal output terminal GP, a source electrode of the second output transistor T5 is electrically connected to the second clock signal terminal.

The power supply voltage terminal is used to input a power supply voltage VDD, the first low voltage terminal is used to input a first low voltage VSS, the first clock signal terminal is used to input a first clock signal CKo, the second clock signal terminal is used to input the second clock signal CBo.

In at least one embodiment of the shift register unit shown in FIG. 8, PD_f is an intermediate node.

In at least one embodiment of the shift register unit shown in FIG. 8, all the transistors are PMOS transistors, but not limited to this.

In at least one embodiment of the shift register unit shown in FIG. 8, the third clock signal is the same as the first clock signal CKo, and the fourth clock signal is the same as the second clock signal CBo, but not limited thereto.

Figure 9:
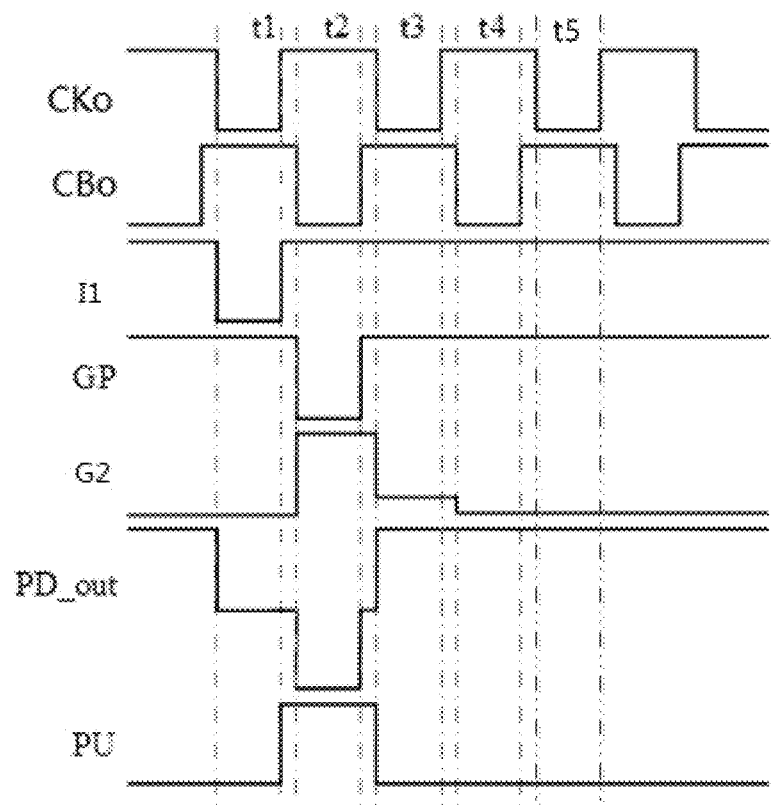
FIG. 9 is a working timing diagram of the shift register unit shown in FIG. 8 according to at least one embodiment of the present disclosure.

As shown in FIG. 9, when at least one embodiment of the shift register unit shown in FIG. 8 of the present disclosure is in operation, the following is implemented.

In the input phase t1, I1 inputs a low level, CKo is a low level, CBo is a high level, T1 is turned on to control the potential of PD_in to be a low level, T8 is turned on, the potential of PD_out is a low level, T3 is turned on, PU is connected to VSS, T4 and T5 are both turned on to output a high voltage through GP; T9 and T11 are turned off, T10 is turned on, the potential of PD_ox is a low level, T12 is turned on, and G2 outputs a low level.

In the output phase t2, I1 inputs a high level, CKo is a high level, CBo is a low level, T1 and T3 are turned off, the potential of PD_in is maintained at a low level, T2 is turned on, so that PU is connected to CKo, PU is a high level, T6 and T4 are turned off, T8 is turned on to maintain the low level of PD_out, T5 is turned on so that the GP outputs a low level, and T9 and T11 are turned on so that the potential of PD_ox is a high level, T12 is turned off, G2 outputs a high level.

In the reset phase t3, I1 inputs a high level, CKo is a low level, CBo is a high level, T3 is turned on, PU is connected to VSS, T4 is turned on, so that GP outputs a high level; T10 is turned on, so that the potential of PD_ox is a low level, T12 is turned on, and G2 outputs a low level. However, due to the presence of the threshold voltage Vth of T12 (since in at least one embodiment of the present disclosure as shown in FIG. 8, T12 is a PMOS tube, so Vth is a negative value), so that the second gate driving signal cannot be reduced to VSS, but to VSS-Vth.

In the first maintenance sub-time period t4, I1 inputs a high level, CKo is a high level, CBo is a low level, and GP outputs a high level. Through the coupling effect of C3, the potential of PD_ox is pulled down, so that T12 is further turned on, G2 outputs VSS.

In the second maintenance sub-time period t5, I1 inputs a high level, CKo is a low level, CBo is a high level, GP outputs a high level, T10 is turned on, PD_ox potential is a low level, T12 is turned on, G2 outputs VSS.

Figure 10:
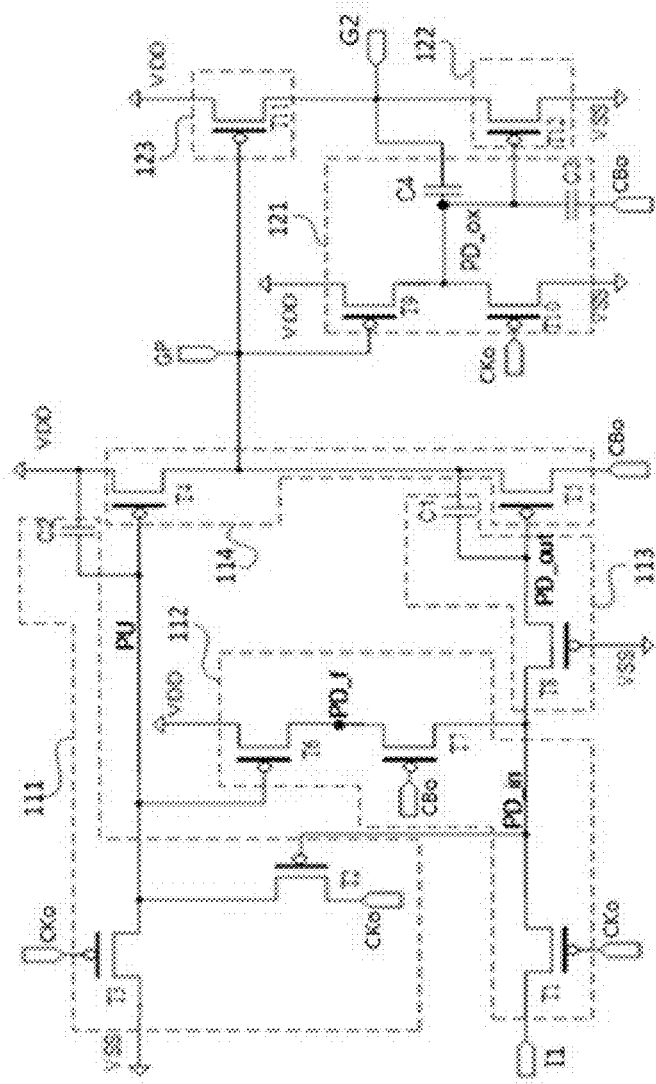
FIG. 10 is a circuit diagram of a shift register unit according to at least one embodiment of the present disclosure.

As shown in FIG. 10, on the basis of at least one embodiment of the shift register unit shown in FIG. 8 of the present disclosure, in at least one embodiment of the shift register unit according to the present disclosure, the first pull-node control circuit 121 may further include a second pull-down node control capacitor C4.

A first end of the second pull-down node control capacitor C4 is electrically connected to the first pull-down node PD_ox, and a second end of the second pull-down node control capacitor C4 is electrically connected to the second gate driving signal output terminal G2.

Figure 11:
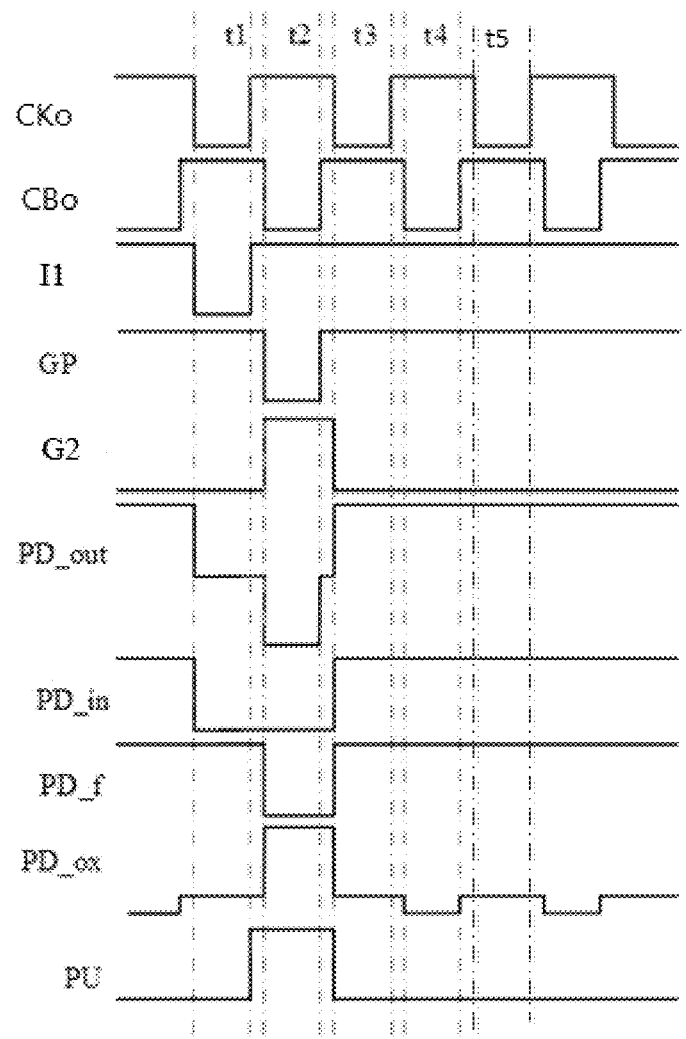
FIG. 11 is a working timing diagram of the shift register unit shown in FIG. 10 according to at least one embodiment of the present disclosure.

As shown in FIG. 11, when at least one embodiment of the shift register unit shown in FIG. 10 of the present disclosure is in operation, the following is implemented.

In the input phase t1, I1 inputs a low level, CKo is a low level, CBo is a high level, T1 is turned on to control the potential of PD_in to be a low level, T8 is turned on, the potential of PD_out is a low level, T3 is turned on, PU is connected to VSS, T4 and T5 are both turned on to output a high voltage through GP; T9 and T11 are turned off, T10 is turned on, the potential of PD_ox is a low level, T12 is turned on, and G2 outputs a low level.

In the output phase t2, I1 inputs a high level, CKo is a high level, CBo is a low level, T1 and T3 are turned off, the potential of PD_in is maintained at a low level, T2 is turned on, so that PU is connected to CKo, PU is a high level, T6 and T4 are turned off, T8 is turned on to maintain PD_out at the low level, T5 is turned on so that GP outputs a low level, and T9 and T11 are turned on so that the potential of PD_ox is a high level, T12 is turned off, G2 outputs a high level.

In the reset phase t3, I1 inputs a high level, CKo is a low level, CBo is a high level, T3 is turned on, PU is connected to VSS, T4 is turned on, so that GP outputs a high level; T10 is turned on, so that the potential of PD_ox is a low level, T12 is turned on, G2 outputs a low level; at the same time, through the coupling effect of C4, the potential of PD_ox is further reduced, so as to avoid the influence of the threshold voltage Vth of T12, and G2 outputs VSS.

In the first maintenance sub-time period t4, I1 inputs a high level, CKo is a high level, CBo is a low level, GP outputs a high level, through the coupling effect of C3, the potential of PD_ox is pulled down, so that T12 is turned on, G2 outputs VSS.

In the second maintenance sub-time period t5, I1 inputs a high level, CKo is a low level, CBo is a high level, GP outputs a high level, T10 is turned on, PD_ox potential is a low level, T12 is turned on, G2 outputs VSS.

In at least one embodiment of the shift register unit shown in FIG. 10 of the present disclosure, the first clock signal is the same as the third clock signal, and the second clock signal is the same as the fourth clock signal.

Figure 12:
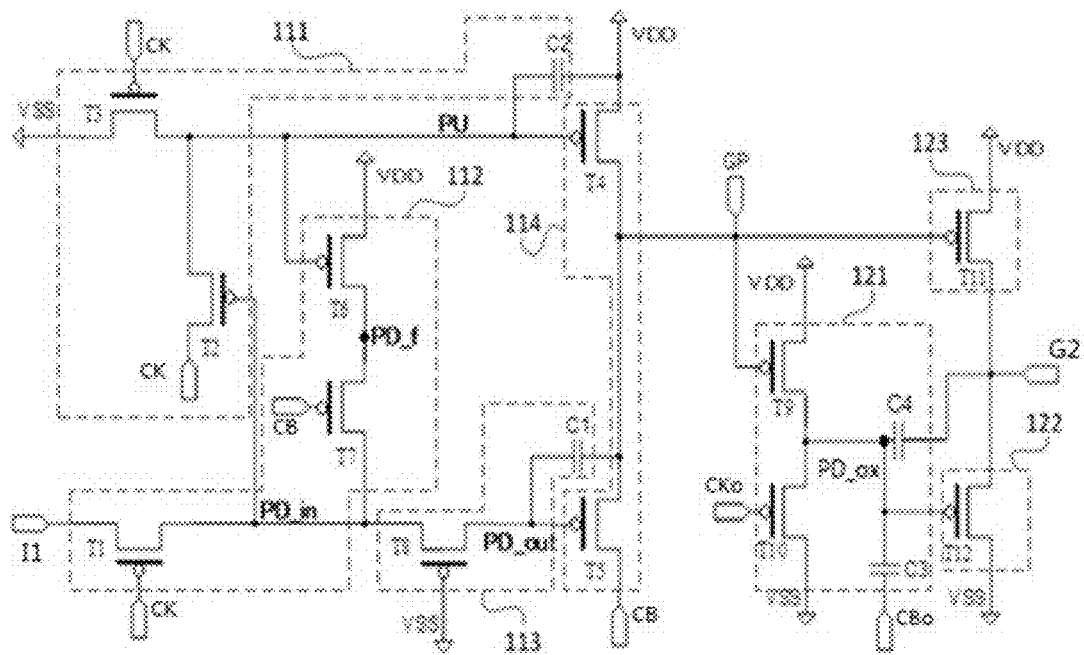
FIG. 12 is a circuit diagram of a shift register unit according to at least one embodiment of the present disclosure.

As shown in FIG. 12, at least one embodiment of the shift register unit of the present disclosure includes a first gate driving output circuit and a second gate driving output circuit.

The second gate driving circuit includes a first pull-down node control circuit 121, a pull-down circuit 122, and an output control circuit 123.

The first pull-down node control circuit 121 includes a first pull-down node control transistor T9, a second pull-down node control transistor T10, a first pull-down node control capacitor C3, and a second pull-down node control capacitor C4.

A gate electrode of the first pull-down node control transistor T9 is electrically connected to the first gate driving signal output terminal GP, a drain electrode of the first pull-down node control transistor T9 is electrically connected to the power supply voltage terminal, a source electrode of the first pull-down node control transistor T9 is electrically connected to the first pull-down node PD_ox; the power supply voltage terminal is used to input the power supply voltage VDD.

A gate electrode of the second pull-down node control transistor T10 is electrically connected to the first clock signal terminal, a drain electrode of the second pull-down node control transistor T10 is electrically connected to the first pull-down node PD_ox, and a source electrode of the second pull-down node control transistor T10 is electrically connected to the first low voltage terminal; the first low voltage terminal is used to input a first low voltage VSS; the first clock signal terminal is used to input a first clock signal CKo.

A first end of the first pull-down node control capacitor C3 is electrically connected to the first pull-down node PD_ox, and a second end of the first pull-down node control capacitor C3 is electrically connected to the second clock signal terminal, The second clock signal terminal is used to input a second clock signal CBo.

A first end of the second pull-down node control capacitor C4 is electrically connected to the first pull-down node PD_ox, and a second end of the second pull-down node control capacitor C4 is electrically connected to the second gate driving signal output terminal G2.

The pull-down circuit 122 includes a pull-down transistor T12. A gate electrode of the pull-down transistor T12 is electrically connected to the first pull-down node PD_ox, a drain electrode of the pull-down transistor T12 is electrically connected to the second gate driving signal output terminal G2, and a source electrode of the pull-down transistor T12 The electrode is electrically connected to the first low voltage end.

The output control circuit 123 includes an output control transistor T11. A gate electrode of the output control transistor T11 is electrically connected to the first gate driving signal output terminal GP, a drain electrode of the output control transistor T11 is electrically connected to the power supply voltage terminal, and a source electrode of the output control transistor T11 is connected to the second gate driving signal output terminal G2.

The first gate driving output circuit includes a pull-up node control circuit 111, a pull-down input node control circuit 112, a second pull-down node control circuit 113, and an output circuit 114.

The pull-up node control circuit 111 includes a pull-up node control transistor T3 and a pull-up node control capacitor C2.

A gate electrode of the pull-up node control transistor T3 is electrically connected to the third clock signal terminal, a drain electrode of the pull-up node control transistor T3 is electrically connected to the first low voltage terminal, and a source electrode of the pull-up node control transistor T3 is electrically connected to the pull-up node PU.

A first end of the pull-up node control capacitor C2 is electrically connected to the pull-up node PU, and a second end of the pull-up node control capacitor C2 is electrically connected to the first low voltage terminal.

The pull-down input node control circuit 112 includes a first pull-down input node control transistor T1, a second pull-down input node control transistor T6, and a third pull-down input node control transistor T7.

A gate electrode of the first pull-down input node control transistor T1 is electrically connected to the third clock signal terminal, a drain electrode of the first pull-down input node control transistor T1 is electrically connected to the input terminal I1, a source electrode of the first pull-down input node control transistor T1 is electrically connected to the pull-down input node PD_in.

A gate electrode of the second pull-down input node control transistor T6 is electrically connected to the pull-up node PU, and a drain electrode of the second pull-down input node control transistor T6 is electrically connected to the power supply voltage terminal.

A gate electrode of the third pull-down input node control transistor T7 is electrically connected to the fourth clock signal terminal, a drain electrode of the third pull-down input node control transistor T7 is connected to the source electrode of the second pull-down input node control transistor T6, a source electrode of the third pull-down input node control transistor T7 is electrically connected to the pull-down input node PD_in.

The second pull-down node control circuit 113 includes a control transistor T8 and a control capacitor C1.

A gate electrode of the control transistor T8 is electrically connected to the first low voltage terminal, a drain electrode of the control transistor T8 is electrically connected to the pull-down input node PD_in, and a source electrode of the control transistor T8 is connected to the second pull-down node PD_out.

A first end of the control capacitor C1 is electrically connected to the second pull-down node PD_out, and a second end of the control capacitor C1 is electrically connected to the first gate driving signal output terminal GP.

The output circuit 114 includes a first output transistor T4 and a second output transistor T5.

A gate electrode of the first output transistor T4 is electrically connected to the pull-up node PU, a drain electrode of the first output transistor T4 is electrically connected to the power supply voltage terminal, and a source electrode of the first output transistor T4 is connected to the first gate driving signal output terminal GP.

A gate electrode of the second output transistor T5 is electrically connected to the second pull-down node PD_out, a drain electrode of the second output transistor T5 is electrically connected to the first gate driving signal output terminal GP, a source electrode of the second output transistor T5 is electrically connected to the fourth clock signal terminal.

The power supply voltage terminal is used to input a power supply voltage VDD, the first low voltage terminal is used to input a first low voltage VSS, the third clock signal terminal is used to input a third clock signal CK, and the fourth clock signal The terminal is used to input the fourth clock signal CB.

In at least one embodiment of the shift register unit shown in FIG. 12 of the present disclosure, PD_f is an intermediate node.

In at least one embodiment of the shift register unit shown in FIG. 12 of the present disclosure, all the transistors are PMOS transistors, but not limited to this.

In at least one embodiment of the shift register unit shown in FIG. 12 of the present disclosure, the third clock signal CK is different from the first clock signal CKo, and the fourth clock signal CB is different from the second clock signal CBo to ensure that when the GP outputs a high level, G2 outputs a low level (the falling edge of CKo and the rising edge of CB occur at the same time), to avoid the phase difference caused by the duty cycle of CK and the duty cycle of CB less than 50%, to ensure the pixel charging time, but it is not limited herein.

Figure 13:
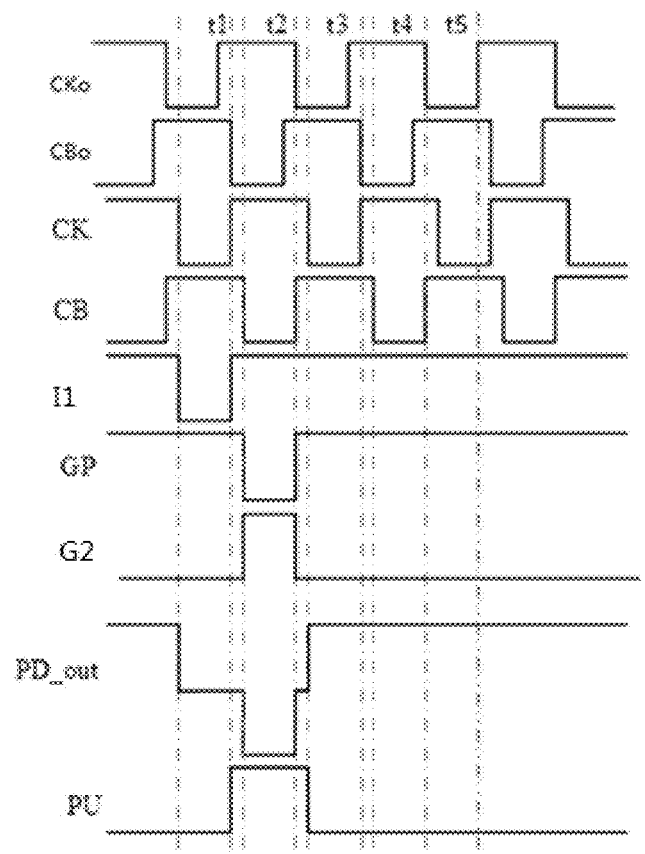
FIG. 13 is a working timing diagram of the shift register unit shown in FIG. 12 according to at least one embodiment of the present disclosure.

As shown in FIG. 13, when at least one embodiment of the shift register unit shown in FIG. 12 of the present disclosure is in operation, the following is implemented.

In the input phase t1, I1 inputs a low level, CKo is a low level, CBo is a high level, T1 is turned on to control the potential of PD_in to be a low level, T8 is turned on, the potential of PD_out is a low level, T3 is turned on, PU is connected to VSS, T4 and T5 are both turned on to output a high voltage through GP; T9 and T11 are turned off, T10 is turned on, the potential of PD_ox is a low level, T12 is turned on, and G2 outputs a low level.

In the output phase t2, I1 inputs a high level, CKo is a high level, CBo is a low level, T1 and T3 are turned off, the potential of PD_in is maintained at a low level, T2 is turned on, so that PU is connected to CKo, so that PU is a high level, T6 and T4 are turned off, T8 is turned on to maintain PD_out to be a low level, T5 is turned on so that GP outputs a low level, and T9 and T11 are turned on so that the potential of PD_ox is a high level, T12 is turned off, G2 outputs a high level.

In the reset phase t3, I1 inputs a high level, CKo is a low level, CBo is a high level, T3 is turned on, PU is connected to VSS, T4 is turned on, so that GP outputs a high level; T10 is turned on, so that the potential of PD_ox is a low level, T12 is turned on, G2 outputs a low level; at the same time, through the coupling effect of C4, the potential of PD_ox is further reduced, so as to avoid the influence of the threshold voltage Vth of T12, and G2 outputs VSS.

In the first maintenance sub-time period t4, I1 inputs a high level, CKo is a high level, CBo is a low level, GP outputs a high level, through the coupling effect of C3, the potential of PD_ox is pulled down, so that T12 is turned on, G2 outputs VSS.

In the second maintenance sub-time period t5, I1 inputs a high level, CKo is a low level, CBo is a high level, GP outputs a high level, T10 is turned on, PD_ox potential is a low level, T12 is turned on, G2 outputs VSS.

Figure 14:
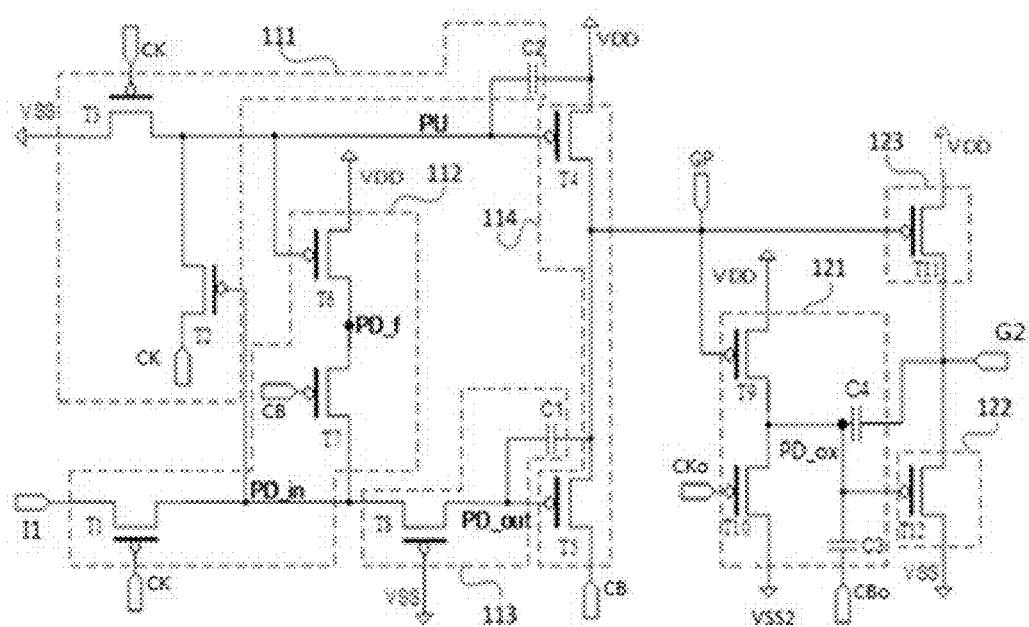
FIG. 14 is a circuit diagram of a shift register unit according to at least one embodiment of the present disclosure.

As shown in FIG. 14, at least one embodiment of the shift register unit described in the present disclosure includes a first gate driving output circuit and a second gate driving output circuit.

The second gate driving circuit includes a first pull-down node control circuit 121, a pull-down circuit 122, and an output control circuit 123.

The first pull-down node control circuit 121 includes a first pull-down node control transistor T9, a second pull-down node control transistor T10, a first pull-down node control capacitor C3, and a second pull-down node control capacitor C4.

A gate electrode of the first pull-down node control transistor T9 is electrically connected to the first gate driving signal output terminal GP, a drain electrode of the first pull-down node control transistor T9 is electrically connected to the power supply voltage terminal, a source electrode of the first pull-down node control transistor T9 is electrically connected to the first pull-down node PD_ox; the power supply voltage terminal is used to input the power supply voltage VDD.

A gate electrode of the second pull-down node control transistor T10 is electrically connected to the first clock signal terminal, a drain electrode of the second pull-down node control transistor T10 is electrically connected to the first pull-down node PD_ox, and a source electrode of the second pull-down node control transistor T10 is electrically connected to the second low voltage terminal; the second low voltage terminal is used to input a second low voltage VSS2; the first clock signal terminal is used to input a first clock signal CKo.

A first end of the first pull-down node control capacitor C3 is electrically connected to the first pull-down node PD_ox, and a second end of the first pull-down node control capacitor C3 is electrically connected to the second clock signal terminal. The second clock signal terminal is used to input a second clock signal CBo.

A first end of the second pull-down node control capacitor C4 is electrically connected to the first pull-down node PD_ox, and a second end of the second pull-down node control capacitor C4 is electrically connected to the second gate driving signal output terminal.

The pull-down circuit 122 includes a pull-down transistor T12. A gate electrode of the pull-down transistor T12 is electrically connected to the first pull-down node PD_ox, a drain electrode of the pull-down transistor T12 is electrically connected to the second gate driving signal output terminal G2, and a source electrode of the pull-down transistor T12 is electrically connected to the first low voltage end.

The output control circuit 123 includes an output control transistor T11. A gate electrode of the output control transistor T11 is electrically connected to the first gate driving signal output terminal GP, a drain electrode of the output control transistor T11 is electrically connected to the power supply voltage terminal, and a source electrode of the output control transistor T11 is connected to the second gate driving signal output terminal G2.

The first gate driving output circuit includes a pull-up node control circuit 111, a pull-down input node control circuit 112, a second pull-down node control circuit 113, and an output circuit 114.

The pull-up node control circuit 111 includes a pull-up node control transistor T3 and a pull-up node control capacitor C2.

A gate electrode of the pull-up node control transistor T3 is electrically connected to the third clock signal terminal, a drain electrode of the pull-up node control transistor T3 is electrically connected to the first low voltage terminal, and a source electrode of the pull-up node control transistor T3 is electrically connected to the pull-up node PU.

A first end of the pull-up node control capacitor C2 is electrically connected to the pull-up node PU, and a second end of the pull-up node control capacitor C2 is electrically connected to the first low voltage terminal.

The pull-down input node control circuit 112 includes a first pull-down input node control transistor T1, a second pull-down input node control transistor T6, and a third pull-down input node control transistor T7.

A gate electrode of the first pull-down input node control transistor T1 is electrically connected to the third clock signal terminal, a drain electrode of the first pull-down input node control transistor T1 is electrically connected to the input terminal I1, a source electrode of the first pull-down input node control transistor T1 is electrically connected to the pull-down input node PD_in.

A gate electrode of the second pull-down input node control transistor T6 is electrically connected to the pull-up node PU, and a drain electrode of the second pull-down input node control transistor T6 is electrically connected to the power supply voltage terminal.

A gate electrode of the third pull-down input node control transistor T7 is electrically connected to the fourth clock signal terminal, a drain electrode of the third pull-down input node control transistor T7 is connected to the source electrode of the second pull-down input node control transistor T6, a source electrode of the third pull-down input node control transistor T7 is electrically connected to the pull-down input node PD_in.

The second pull-down node control circuit 113 includes a control transistor T8 and a control capacitor C1.

A gate electrode of the control transistor T8 is electrically connected to the first low voltage terminal, a drain electrode of the control transistor T8 is electrically connected to the pull-down input node PD_in, and a source electrode of the control transistor T8 is connected to the second pull-down node PD_out.

A first end of the control capacitor C1 is electrically connected to the second pull-down node PD_out, and a second end of the control capacitor C1 is electrically connected to the first gate driving signal output terminal GP.

The output circuit 114 includes a first output transistor T4 and a second output transistor T5.

A gate electrode of the first output transistor T4 is electrically connected to the pull-up node PU, a drain electrode of the first output transistor T4 is electrically connected to the power supply voltage terminal, and a source electrode of the first output transistor T4 is connected to the first gate driving signal output terminal GP.

A gate electrode of the second output transistor T5 is electrically connected to the second pull-down node PD_out, a drain electrode of the second output transistor T5 is electrically connected to the first gate driving signal output terminal GP, a source electrode of the second output transistor T5 is electrically connected to the fourth clock signal terminal.

The power supply voltage terminal is used to input a power supply voltage VDD, the first low voltage terminal is used to input a first low voltage VSS, the third clock signal terminal is used to input a third clock signal CK, and the fourth clock signal The terminal is used to input the fourth clock signal CB.

In at least one embodiment of the shift register unit shown in FIG. 14 of the present disclosure, PD_f is an intermediate node.

In at least one embodiment of the shift register unit shown in FIG. 14 of the present disclosure, all the transistors are PMOS transistors, but not limited to this.

In at least one embodiment of the shift register unit shown in FIG. 14 of the present disclosure, VSS2 is smaller than VSS.

In at least one embodiment of the shift register unit shown in FIG. 14 of the present disclosure, the third clock signal CK is different from the first clock signal CKo, and the fourth clock signal CB is different from the second clock signal CBo, but this is not the case limit.

Figure 15:
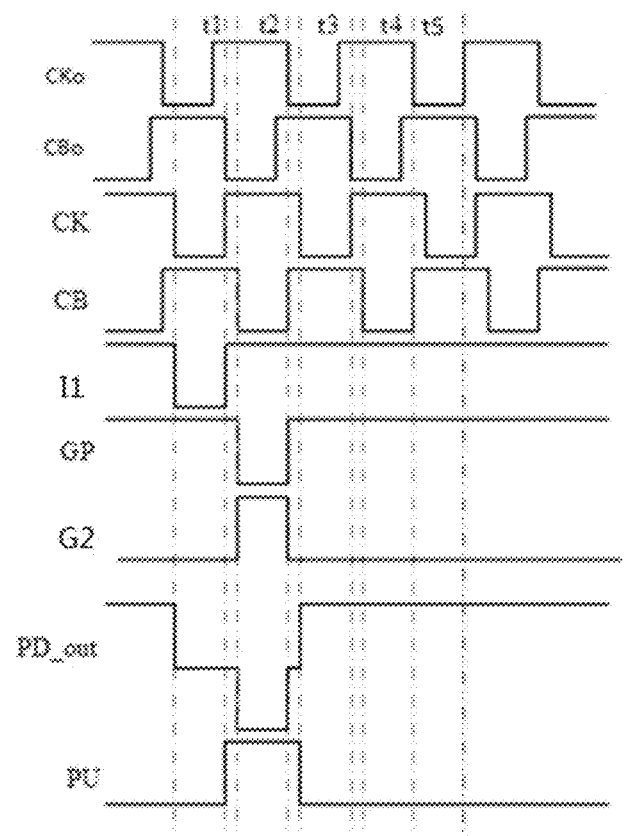
FIG. 15 is a working timing diagram of the shift register unit shown in FIG. 14 according to at least one embodiment of the present disclosure.

As shown in FIG. 15, when at least one embodiment of the shift register unit shown in FIG. 14 of the present disclosure is in operation, the following is implemented.

In the input phase t1, I1 inputs a low level, the potential of CKo is the second low voltage VSS2, CBo is a high level, T1 is turned on to control the potential of PD_in to be a low level, T8 is turned on, and the potential of PD_out is a low level, T3 is turned on, PU is connected to VSS, T4 and T5 are turned on so that GP outputs a high voltage; T9 and T11 are turned off, T10 is turned on, the potential of PD_ox is a low level, T12 is turned on, G2 outputs a low level.

In the output phase t2, I1 inputs a high level, CKo is a high level, the potential of CBo is the second low voltage VSS2, T1 and T3 are turned off, the potential of PD_in is maintained at a low level, T2 is turned on, so that the PU is connected CKo and the potential of PU is a high level, T6 and T4 are turned off, T8 is turned on to maintain PD_out to be the low level, T5 is turned on so that GP outputs a low level, T9 and T11 are turned on, so that the potential of PD_ox is a high level, T12 is turned off, G2 outputs a high level.

In the reset phase t3, I1 inputs a high level, CKo potential is the second low voltage VSS2, CBo is a high level, T3 is turned on, PU is connected to VSS, T4 is turned on, so that GP outputs a high level; T10 is turned on, the potential of PD_ox is a low level, T12 is turned on, and G2 outputs a low level; at the same time, the potential of PD_ox is further reduced by the coupling effect of C4, thereby avoiding the influence of the threshold voltage Vth of T12, and G2 outputs VSS; and because VSS2 is less than VSS, the potential of PD_ox is lower than VSS, which can ensure that the potential of the second gate driving signal returns to VSS at the fastest speed.

In the first maintenance sub-time period t4, I1 inputs a high level, CKo is a high level, the potential of CBo is a second low voltage VSS2, and the GP outputs a high level. Through the coupling effect of C3, the potential of PD_ox is pulled down so that T12 is turned on, G2 outputs VSS.

In the second maintenance sub-time period t5, I1 inputs a high level, the potential of CKo is a second low voltage VSS2, CBo is a high level, GP outputs a high level, T10 is turned on, the potential of PD_ox is a low level, and T12 is turned on, G2 outputs VSS.

In the related art, in order to keep the fluctuation of the pixel brightness within a reasonable range, because the voltage that controls the brightness changes with time due to current leakage, the data still needs to be refreshed when a static image is shown. In order to reduce power consumption, it is an effective method to and reduce the refresh frequency, while maintaining the display quality, it is necessary to reduce the speed of pixel current leakage, and the oxide semiconductor has ultra-low current leakage characteristics to meet this demand. In order to ensure pixel charging speed and small parasitic capacitance, a better way is to combine the advantages of Low Temperature Polysilicon (LTPS) and oxide, using a Low Temperature Polycrystalline Oxide (LTPO) process.

In order to reduce the large noise outputted by the shift register unit at an ultra-low refresh frequency (for example, the refresh frequency is 1 Hz), to avoid affecting the normal retention of pixel, at least one embodiment of the present disclosure uses a dual-gate transistor connected in series to reduce the current leakage of the switching transistor having a source (or drain) electrode connected to a level signal reversed to that in the output cut-off maintenance phase, ensuring the output stability of GOA (Gate on Array) under low frequency driving, so as to realize the switching control signal required for the low-frequency driving of the pixel.

In at least one embodiment of the present disclosure, the switching transistor having a source (or drain) electrode connected to a level signal reversed to that in the output cut-off maintenance phase refers to: in the output cut-off maintenance phase, the potential of the source electrode of the switching transistor needs to be maintained at the first level, and the potential of the drain electrode of the switching transistor is the second level; or in the output cut-off maintenance phase, the potential of the source electrode of the switching transistor needs to be maintained at the second level, and the potential of the drain electrode of the switching transistor is the first level; or in the output cut-off maintenance phase, the potential of the drain electrode of the switching transistor needs to be maintained at the first level, and the potential of the source electrode of the switching transistor is the second level; or in the output cut-off maintenance phase, the potential of the drain electrode of the switching transistor needs to be maintained at the second level, and the potential of the source electrode of the switching transistor is the first level.

In order to improve the leakage problem of GOA under low-frequency driving, a leakage analysis is performed on the shift register unit shown in FIG. 10 of the present disclosure. When the shift register unit shown in FIG. 10 of the present disclosure is in operation, in the output phase t2, the potentials of each signal and each node are as shown in FIG. 11. The voltage of the source electrode of T1 is different from the voltage of the drain electrode of T1, the voltage of the source electrode of T3 is different from the voltage of the drain electrode of T3, the voltage of the source electrode of T6 is different from the voltage of the drain electrode of T6, the voltage of the source electrode of T8 is different from the voltage of the drain electrode of T8, excessive current leakage of the transistor will cause GOA to work abnormally. Taking T3 as an example, in the output phase t2, the potential of the PU is a high level VDD, then the drain-source voltage of T3 is equal to VDD-VSS, if the current leakage of T3 is excessive, the potential of the PU is close to VSS, so that T4 is turned on, thereby pulling up the potential of GP, so that T9 and T11 are not insufficiently conductive, which further pull down the potential of G2, the normal charge and discharge of the pixel is adversely affected. In the reset phase t3, the first maintenance sub-period t4 and the second maintenance sub-time period t5, the potentials of each signal and each node are shown in FIG. 11. The voltage of the source electrode of T2 is different from the voltage of the drain electrode of T2, the voltage of the source electrode of T5 is different from the voltage of the drain electrode of T5, the voltage of the source electrode of T9 is different from the voltage of the drain electrode of T9, the voltage of the source electrode of T10 is different from the voltage of the drain electrode of T10, the voltage of the source electrode of T11 is different from the voltage of the drain electrode of T11, the excessive current leakage of the transistor causes the GOA to work abnormally. Taking T11 as an example, in the reset phase t3, the first maintenance sub-period t4 and the second maintenance sub-period t5, the potential of G2 is VSS, then the drain-source voltage of T11 is VDD-VSS, if the current leakage of T11 is extensive, then the potential of G2 is close to VDD, the normal charge and discharge of pixels is adversely affected.

Figure 16:
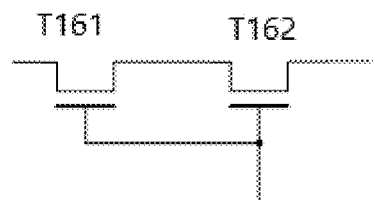
FIG. 16 is a circuit diagram of series double-gate transistors according to at least one embodiment of the present disclosure.

In at least one embodiment of the present disclosure, as shown in FIG. 16, the dual-gate transistor connected in series may include a first sub-transistor T161 and a second sub-transistor T162 connected in series with each other; the gate electrode of T161 is connected to the gate electrode of T162, the second electrode of T161 is electrically connected to the first electrode of T162, the first electrode of T161 is the first electrode of the series double-gate transistor, and the second electrode of T162 is the second electrode of the series double-gate transistor.

Figure 17:
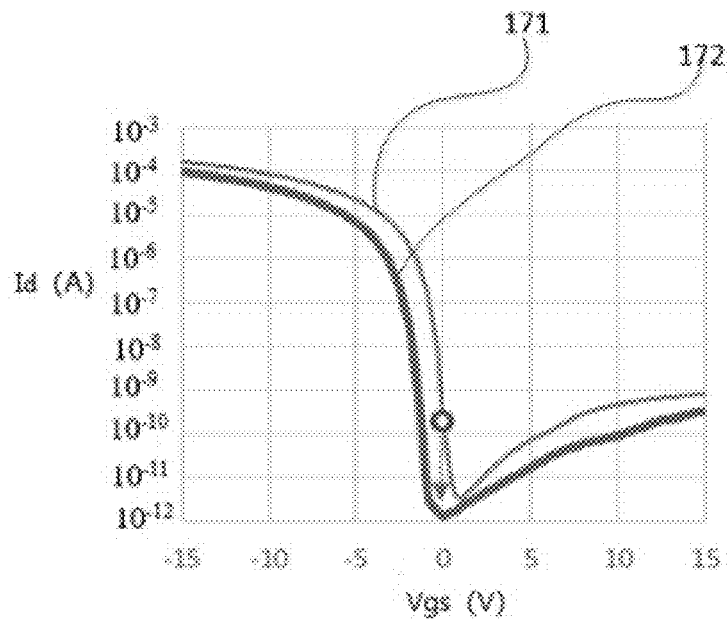
FIG. 17 is a schematic diagram of the relationship between the gate-source voltage Vgs and the drain current Id of a single gate transistor when the drain-source voltage is −10.1V, and the relationship between the gate-source voltage Vgs and the drain current Id of series double-gate transistors when the drain-source voltage is −10.1V.

The schematic diagram of the relationship between the gate-source voltage Vgs and the drain current Id of the single-gate transistor when the drain-source voltage is −10.1V is shown by the curve 171 in FIG. 17. In FIG. 17, the horizontal axis is Vgs and the unit is V (volt), and the vertical axis is Id and the unit is A (ampere).

The schematic diagram of the relationship between the gate-source voltage Vgs and the drain current Id when the drain-source voltage of the series double-gate transistor is −10.1V is shown by curve 172 in FIG. 17.

Comparing the two curves in FIG. 17, it can be seen that under the same drain-source voltage, when the gate-source voltage is equal to 0, the leakage current of the series double-gate transistor is much smaller than that of the single-gate transistor.

Optionally, the output control transistor may be a series double-gate transistor, that is, the output control transistor may include a first transistor and a second transistor connected in series with each other;

A control electrode of the first transistor is electrically connected to a control electrode of the second transistor, a first electrode of the first transistor is the first electrode of the output control transistor, a second electrode of the first transistor is connected to a first electrode of the second transistor, a second electrode of the second transistor is the second electrode of the output control transistor.

Optionally, the first pull-down node control transistor may be a series double-gate transistor, and/or, the second pull-down node control transistor may be a series double-gate transistor.

The first pull-down node control transistor includes a third transistor and a fourth transistor connected in series with each other; and/or, the second pull-down node control transistor includes a fifth transistor and a sixth transistor connected in series with each other.

A control electrode of the third transistor is electrically connected to a control electrode of the fourth transistor, a first electrode of the third transistor is the first electrode of the first pull-down node control transistor, and a second electrode of the third transistor is electrically connected to a first electrode of the fourth transistor, a second electrode of the fourth transistor is the second electrode of the first pull-down node control transistor.

A control electrode of the fifth transistor is electrically connected to a control electrode of the sixth transistor, a first electrode of the fifth transistor is the first electrode of the second pull-down node control transistor, a second electrode of the fifth transistor is electrically connected to a first electrode of the sixth transistor, and a second electrode of the sixth transistor is the second electrode of the second pull-down node control transistor.

Optionally, the first pull-up node control transistor is a series double-gate transistor, and/or, the second pull-up node control transistor is a series double-gate transistor.

The first pull-up node control transistor includes a seventh transistor and an eighth transistor connected in series with each other; and/or, the second pull-up node control transistor includes a ninth transistor and a tenth transistor connected in series with each other.

A control electrode of the seventh transistor is electrically connected to a control electrode of the eighth transistor, a first electrode of the seventh transistor is the first electrode of the first pull-up node control transistor, a second electrode of the seventh transistor is electrically connected to a first electrode of the eighth transistor, a second electrode of the eighth transistor is the second electrode of the first pull-up node control transistor.

A control electrode of the ninth transistor is electrically connected to a control electrode of the tenth transistor, a first electrode of the ninth transistor is the first electrode of the second pull-up node control transistor, a second electrode of the ninth transistor is electrically connected to a first electrode of the tenth transistor, a second electrode of the tenth transistor is the second electrode of the second pull-up node control transistor.

Optionally, the first pull-down input node control transistor may be a series double-gate transistor, and the second pull-down input node control transistor may be a series double-gate transistor.

The first pull-down input node control transistor may include an eleventh transistor and a twelfth transistor; and/ or, the second pull-down input node control transistor may include a thirteenth transistor and a fourteenth transistor.

A control electrode of the eleventh transistor is electrically connected to a control electrode of the twelfth transistor, a first electrode of the eleventh transistor, is the first electrode of the first pull-down input node control transistor, a second electrode of the eleventh transistor is electrically connected to a first electrode of the twelfth transistor, a second electrode of the twelfth transistor is the second electrode of the first pull-down input node control transistor.

A control electrode of the thirteenth transistor is electrically connected to a control electrode of the fourteenth transistor, a first electrode of the thirteenth transistor is the first electrode of the second pull-down input node control transistor, a second electrode of the thirteen transistor is electrically connected to a first electrode of the fourteenth transistor, a second electrode of the fourteenth transistor is the second electrode of the second pull-down input node control transistor.

Optionally, the control transistor is a series double-gate transistor, and/or, the second output transistor is a series double-gate transistor.

The control transistor includes a fifteenth transistor and a sixteenth transistor connected in series with each other; and/or, the second output transistor includes a seventeenth transistor and an eighteenth transistor connected in series with each other.

A control electrode of the fifteenth transistor is electrically connected to a control electrode of the sixteenth transistor, a first electrode of the fifteenth transistor is the first electrode of the control transistor, a second electrode of the fifteenth transistor is electrically connected to a first electrode of the sixteenth transistor, and a second electrode of the sixteenth transistor is the second electrode of the control transistor.

A control electrode of the seventeenth transistor is electrically connected to a control electrode of the eighteenth transistor, a first electrode of the seventeenth transistor is the first electrode of the second output transistor, and a second electrode is of the seventeenth transistor is electrically connected to a first electrode of the eighteenth transistor, and a second electrode of the eighteenth transistor is the second electrode of the second output transistor.

Figure 18:
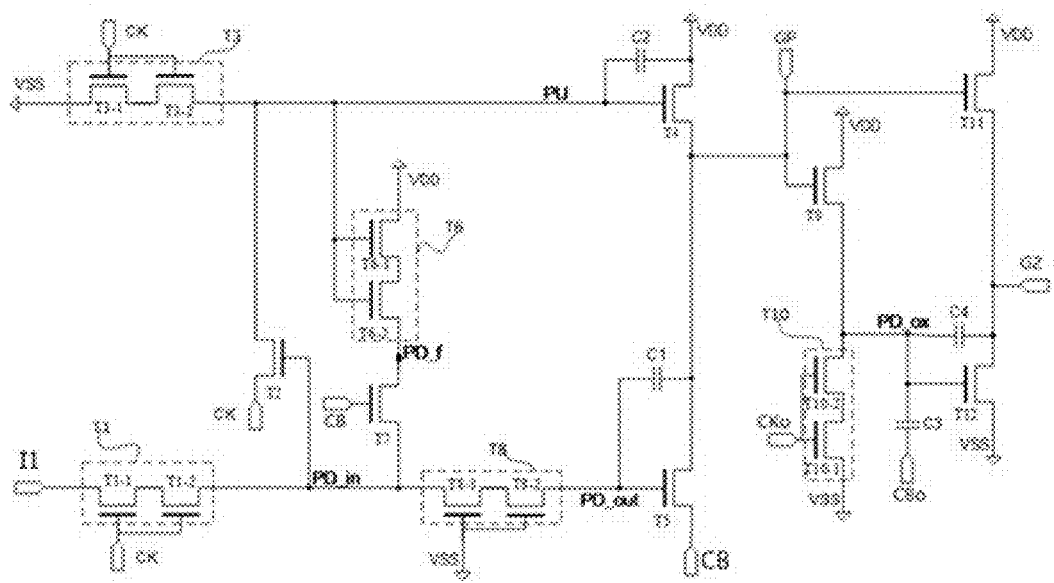
FIG. 18 is a circuit diagram of a shift register unit according to at least one embodiment of the present disclosure.

As shown in FIG. 18, on the basis of the shift register unit shown in FIG. 12 of the present disclosure, the shift register unit described in at least one embodiment of the present disclosure is as follows.

The first pull-up node control transistor T3 is a series double-gate transistor, the first pull-down input node control transistor T1 is a series double-gate transistor, and the second pull-down input node control transistor T6 is a series double-gate transistor; the control transistor T8 is a series double-gate transistor; the second pull-down node control transistor T10 is a series double-gate transistor.

The first pull-up node control transistor T3 includes a seventh transistor T3-1 and an eighth transistor T3-2 connected in series with each other.

The gate electrode of the seventh transistor T3-1 is electrically connected to the gate electrode of the eighth transistor T3-2, the source electrode of the seventh transistor T3-1 is the source electrode of the second pull-up node control transistor T3, the drain electrode of the seventh transistor T3-1 is electrically connected to the source electrode of the eighth transistor T3-2, and the drain electrode of the eighth transistor T3-1 is the drain electrode of the second pull-up node control transistor T3.

The first pull-down input node control transistor T1 includes an eleventh transistor T1-1 and a twelfth transistor T1-2; the second pull-down input node control transistor T6 includes a thirteenth transistor T6-1 and a fourteenth transistor T6-2.

The gate electrode of the eleventh transistor T1-1 is electrically connected to the gate electrode of the twelfth transistor T1-2, and the source electrode of the eleventh transistor T1-1 is the source electrode of the first pull-down input node control transistor T1, the drain electrode of the eleventh transistor T1-1 is electrically connected to the source electrode of the twelfth transistor T1-2, and the drain electrode of the twelfth transistor T1-2 is the drain electrode of the first pull-down input node control transistor T1.

The gate electrode of the thirteenth transistor T6-1 is electrically connected to the gate electrode of the fourteenth transistor T6-2, and the source electrode of the thirteenth transistor T6-1 is the source electrode of the second pull-down input node control transistor T6, the drain electrode of the thirteenth transistor T6-1 is electrically connected to the source electrode of the fourteenth transistor T6-2, and the drain electrode of the fourteenth transistor T6-2 is the drain electrode of the second pull-down input node control transistor T6.

The second pull-down node control transistor T10 includes a fifth transistor T10-1 and a sixth transistor T10-2 connected in series with each other.

The gate electrode of the fifth transistor T10-1 is electrically connected to the gate electrode of the sixth transistor T10-2, the source electrode of the fifth transistor T10-1 is the source electrode of the second pull-down node control transistor T10, the drain electrode of the fifth transistor T10-1 is electrically connected to the source electrode of the sixth transistor T10-2, and the drain electrode of the sixth transistor T10-2 is the drain electrode of the second pull-down node control transistor T10.

The control transistor T8 includes a fifteenth transistor T8-1 and a sixteenth transistor T8-2 connected in series with each other.

The gate electrode of the fifteenth transistor T8-1 is electrically connected to the gate electrode of the sixteenth transistor T8-2, the source electrode of the fifteenth transistor T8-1 is the source electrode of the control transistor T8, the drain electrode of the fifteenth transistor T8-1 is electrically connected to the source electrode of the sixteenth transistor T8-2, and the drain electrode of the sixteenth transistor T8-2 is the drain electrode of the control transistor T8.

In at least one embodiment of the shift register unit shown in FIG. 18 of the present disclosure, T3, T1, T6, T8, and T10 are replaced with double-gate transistors to ensure the potential of PU, the potential of PD_in, the potential of PD_f, the potential of PD_out and the potential of PD_ox are stable, which is suitable for the frequency reduction driving method in which the row driving time is delayed.

Figure 19:
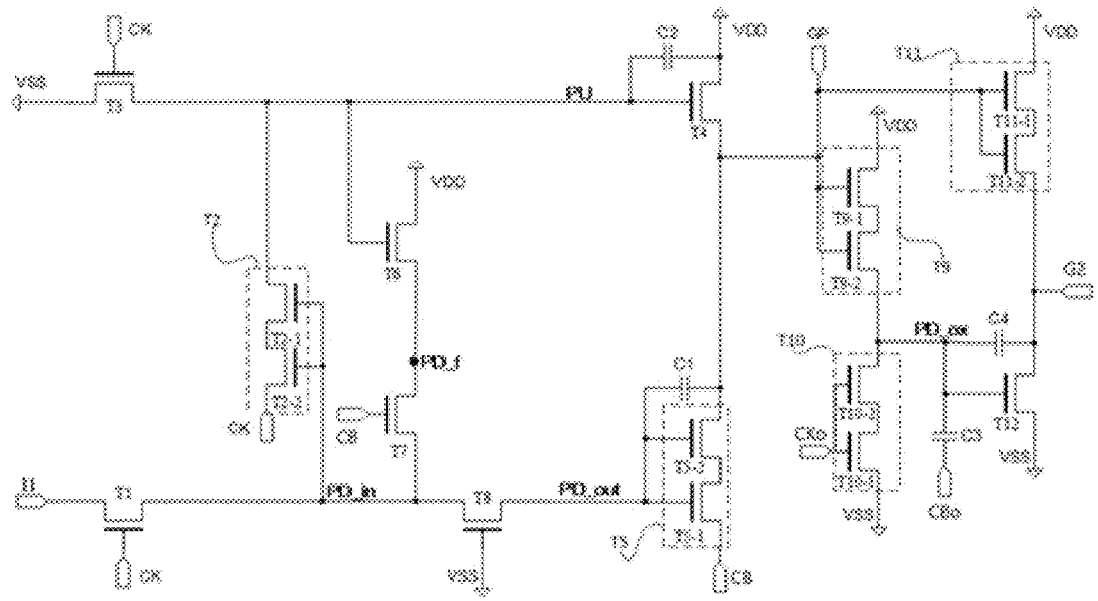
FIG. 19 is a circuit diagram of the shift register unit shown in FIG. 18 according to at least one embodiment of the present disclosure.

As shown in FIG. 19, on the basis of the shift register unit shown in FIG. 12 of the present disclosure, the shift register unit described in the at least one embodiment of the present disclosure is as follows.

The second pull-up node control transistor T2 is a series double-gate transistor, the second output transistor T5 is a series double-gate transistor, the first pull-down node control transistor T9 is a series double-gate transistor, and the second pull-down node control transistor T10 is a series double-gate transistor, and the output control transistor T11 is a series double-gate transistor.

The second pull-up node control transistor T2 includes a ninth transistor T2-1 and a tenth transistor T2-2 connected in series with each other.

The gate electrode of the ninth transistor T2-1 is electrically connected to the gate electrode of the tenth transistor T2-2, the source electrode of the ninth transistor T2-1 is the source electrode of the second pull-up node control transistor T2, the drain electrode of the ninth transistor T2-1 is electrically connected to the source electrode of the tenth transistor T2-2, and the drain electrode of the tenth transistor T2-2 is the drain electrode of the second pull-up node control transistor T2.

The second output transistor T5 includes a seventeenth transistor T5-1 and an eighteenth transistor T5-2 connected in series with each other.

The gate electrode of the seventeenth transistor T5-1 is electrically connected to the gate electrode of the eighteenth transistor T5-2, the source electrode of the seventeenth transistor T5-1 is the source electrode of the second output transistor T5, the drain electrode of the seventeenth transistor T5-1 is electrically connected to the source electrode of the eighteenth transistor T5-2, and the drain electrode of the eighteenth transistor T5-2 is the drain electrode of the second output transistor T5 electrode.

The first pull-down node control transistor T9 includes a third transistor T9-1 and a fourth transistor T9-2 connected in series with each other; the second pull-down node control transistor T10 includes a fifth transistor T10-1 and a sixth transistor connected in series with each other Transistor T10-2.

The gate electrode of the third transistor T9-1 is electrically connected to the gate electrode of the fourth transistor T9-2, the source electrode of the third transistor T9-1 is the source electrode of the first pull-down node control transistor T9, the drain electrode of the third transistor T9-1 is electrically connected to the source electrode of the fourth transistor T9-2, and the drain electrode of the fourth transistor T9-2 is the drain electrode of the first pull-down node control transistor T9.

The gate electrode of the fifth transistor T10-1 is electrically connected to the gate electrode of the sixth transistor T10-2, the source electrode of the fifth transistor T10-1 is the source electrode of the second pull-down node control transistor T10, the drain electrode of the fifth transistor T10-1 is electrically connected to the drain electrode of the sixth transistor T10-2, and the drain electrode of the sixth transistor T10-2 is the drain electrode of the second pull-down node control transistor T10.

The output control transistor T11 includes a first transistor T11-1 and a second transistor T11-2.

The gate electrode of the first transistor T11-1 is electrically connected to the gate electrode of the second transistor T11-2, the source electrode of the first transistor T11-1 is the source electrode of the output control transistor T11, the drain electrode of the first transistor T11-1 is electrically connected to the source electrode of the second transistor T11-2, and the drain electrode of the second transistor T11-2 is the drain electrode of the output control transistor T11.

In at least one embodiment of the shift register unit shown in FIG. 19 of the present disclosure, T2, T5, T9, T10, and T11 are replaced with series double-gate transistors to ensure that the potential of the GP and the potential of G2 are stable, which is suitable for Frame Skip frequency reduction driving method.

Figure 20:
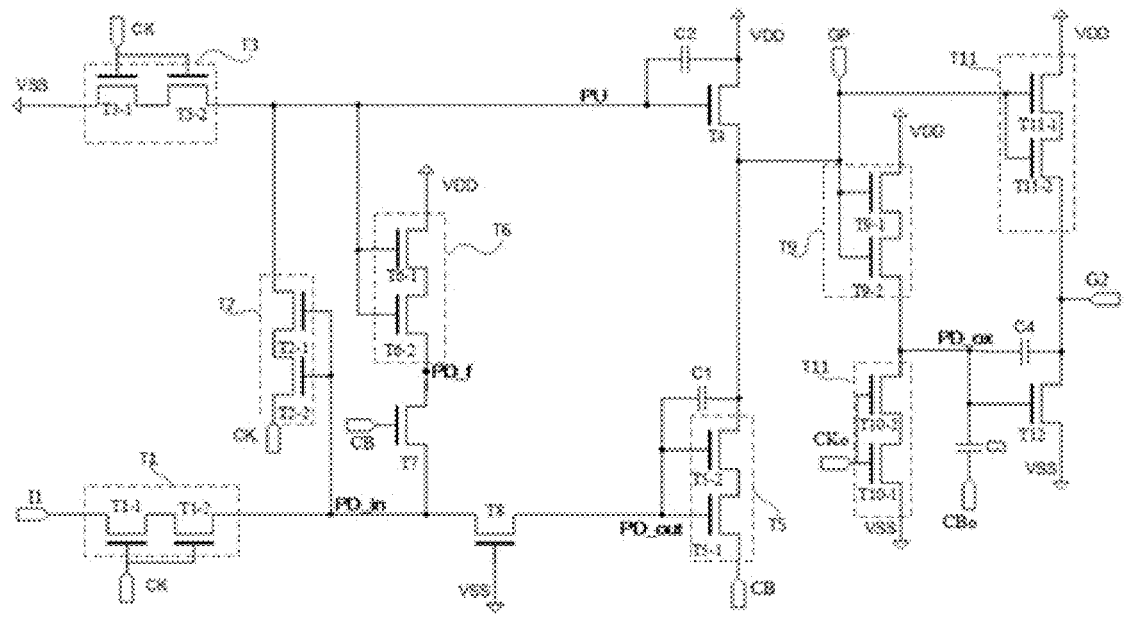
FIG. 20 is a circuit diagram of the shift register unit according to at least one embodiment of in this disclosure.

As shown in FIG. 20, on the basis of the shift register unit shown in FIG. 12 of the present disclosure, at least one embodiment of the shift register unit described in the present disclosure is as follows.

The second pull-up node control transistor T2 is a series double-gate transistor, the second output transistor T5 is a series double-gate transistor, the first pull-down node control transistor T9 is a series double-gate transistor, and the second pull-down node control transistor T10 is a series double-gate transistor, the output control transistor T11 is a series double-gate transistor, the first pull-up node control transistor T3 is a series double-gate transistor, and the first pull-down input node control transistor T1 is a series double-gate transistor.

The first pull-up node control transistor T3 includes a seventh transistor T3-1 and an eighth transistor T3-2 connected in series with each other.

The gate electrode of the seventh transistor T3-1 is electrically connected to the gate electrode of the eighth transistor T3-2, the source electrode of the seventh transistor T3-1 is the source electrode of the second pull-up node control transistor T3, the drain electrode of the seventh transistor T3-1 is electrically connected to the source electrode of the eighth transistor T3-2, and the drain electrode of the eighth transistor T3-1 is the drain electrode of the second pull-up node control transistor T3.

The first pull-down input node control transistor T1 includes an eleventh transistor T1-1 and a twelfth transistor T1-2.

The gate electrode of the eleventh transistor T1-1 is electrically connected to the gate electrode of the twelfth transistor T1-2, and the source electrode of the eleventh transistor T1-1 is the source electrode of the first pull-down input node control transistor T1, the drain electrode of the eleventh transistor T1-1 is electrically connected to the source electrode of the twelfth transistor T1-2, and the drain electrode of the twelfth transistor T1-2 is the drain electrode of the first pull-down input node control transistor T1.

The second pull-up node control transistor T2 includes a ninth transistor T2-1 and a tenth transistor T2-2 connected in series with each other.

The gate electrode of the ninth transistor T2-1 is electrically connected to the gate electrode of the tenth transistor T2-2, the source electrode of the ninth transistor T2-1 is the source electrode of the second pull-up node control transistor T2, the drain electrode of the ninth transistor T2-1 is electrically connected to the source electrode of the tenth transistor T2-2, and the drain electrode of the tenth transistor T2-2 is the drain electrode of the second pull-up node control transistor T2.

The second output transistor T5 includes a seventeenth transistor T5-1 and an eighteenth transistor T5-2 connected in series with each other.

The gate electrode of the seventeenth transistor T5-1 is electrically connected to the gate electrode of the eighteenth transistor T5-2, the source electrode of the seventeenth transistor T5-1 is the source electrode of the second output transistor T5, the drain electrode of the seventeenth transistor T5-1 is electrically connected to the source electrode of the eighteenth transistor T5-2, and the drain electrode of the eighteenth transistor T5-2 is the drain electrode of the second output transistor T5 electrode.

The first pull-down node control transistor T9 includes a third transistor T9-1 and a fourth transistor T9-2 connected in series with each other; the second pull-down node control transistor T10 includes a fifth transistor T10-1 and a sixth transistor connected in series with each other Transistor T10-2.

The gate electrode of the third transistor T9-1 is electrically connected to the gate electrode of the fourth transistor T9-2, the source electrode of the third transistor T9-1 is the source electrode of the first pull-down node control transistor T9, the drain electrode of the third transistor T9-1 is electrically connected to the source electrode of the fourth transistor T9-2, and the drain electrode of the fourth transistor T9-2 is the drain electrode of the first pull-down node control transistor T9

The gate electrode of the fifth transistor T10-1 is electrically connected to the gate electrode of the sixth transistor T10-2, the source electrode of the fifth transistor T10-1 is the source electrode of the second pull-down node control transistor T10, the drain electrode of the fifth transistor T10-1 is electrically connected to the drain electrode of the sixth transistor T10-2, and the drain electrode of the sixth transistor T10-2 is the drain electrode of the second pull-down node control transistor T10.

The output control transistor T11 includes a first transistor T11-1 and a second transistor T11-2.

The gate electrode of the first transistor T11-1 is electrically connected to the gate electrode of the second transistor T11-2, the source electrode of the first transistor T11-1 is the source electrode of the output control transistor T11, the drain electrode of the first transistor T11-1 is electrically connected to the source electrode of the second transistor T11-2, and the drain electrode of the second transistor T11-2 is the drain electrode of the output control transistor T11.

In at least one embodiment of the shift register unit shown in FIG. 20 of the present disclosure, T2, T5, T9, T10, T11, T3, and T1 are replaced with series double-gate transistors to ensure that the potential of PU, the potential of PD_in, the potential of PD_f, the potential of PD_out, the potential of PD_ox, the potential of GP, and the potential of G2 are more stable, which is suitable for various commonly used frequency reduction driving methods.

Figure 21:
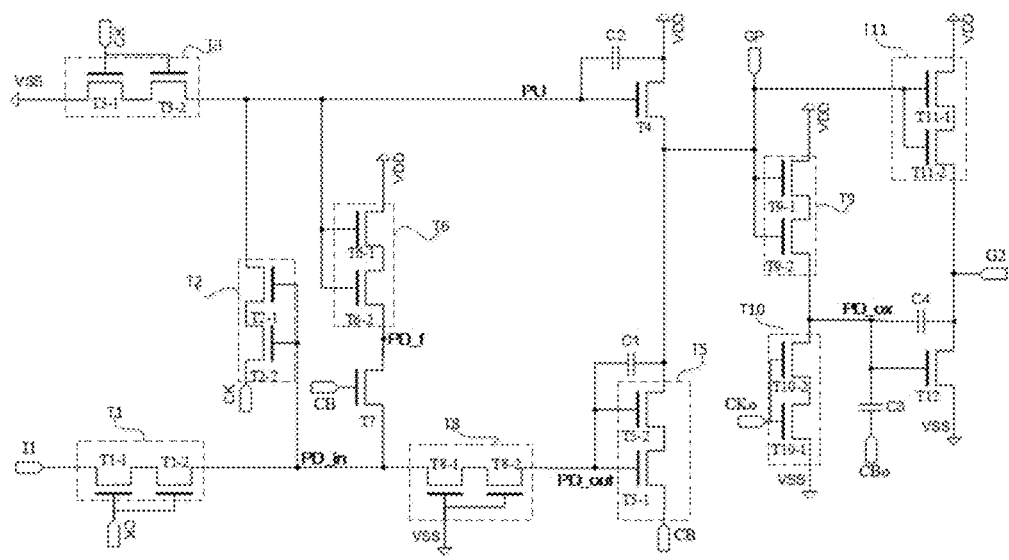
FIG. 21 is a circuit diagram of the shift register unit shown in FIG. 20 according to at least one embodiment of the present disclosure.

As shown in FIG. 21, on the basis of the shift register unit shown in FIG. 12 of the present disclosure, at least one embodiment of the shift register unit described in the present disclosure is as follows.

The second pull-up node control transistor T2 is a series double-gate transistor, the second output transistor T5 is a series double-gate transistor, the first pull-down node control transistor T9 is a series double-gate transistor, and the second pull-down node control transistor T10 is a series double-gate transistor, the output control transistor T11 is a series double-gate transistor, the first pull-up node control transistor T3 is a series double-gate transistor, and the first pull-down input node control transistor T1 is a series double-gate transistor, the control transistor T8 is a series double-gate transistor; the second pull-down input node control transistor T6 is a series double-gate transistor.

The first pull-up node control transistor T3 includes a seventh transistor T3-1 and an eighth transistor T3-2 connected in series with each other.

The gate electrode of the seventh transistor T3-1 is electrically connected to the gate electrode of the eighth transistor T3-2, the source electrode of the seventh transistor T3-1 is the source electrode of the second pull-up node control transistor T3, the drain electrode of the seventh transistor T3-1 is electrically connected to the source electrode of the eighth transistor T3-2, and the drain electrode of the eighth transistor T3-1 is the drain electrode of the second pull-up node control transistor T3.

The first pull-down input node control transistor T1 includes an eleventh transistor T1-1 and a twelfth transistor T1-2.

The gate electrode of the eleventh transistor T1-1 is electrically connected to the gate electrode of the twelfth transistor T1-2, and the source electrode of the eleventh transistor T1-1 is the source electrode of the first pull-down input node control transistor T1, the drain electrode of the eleventh transistor T1-1 is electrically connected to the source electrode of the twelfth transistor T1-2, and the drain electrode of the twelfth transistor T1-2 is the drain electrode of the first pull-down input node control transistor T1.

The second pull-up node control transistor T2 includes a ninth transistor T2-1 and a tenth transistor T2-2 connected in series with each other.

The gate electrode of the ninth transistor T2-1 is electrically connected to the gate electrode of the tenth transistor T2-2, the source electrode of the ninth transistor T2-1 is the source electrode of the second pull-up node control transistor T2, the drain electrode of the ninth transistor T2-1 is electrically connected to the source electrode of the tenth transistor T2-2, and the drain electrode of the tenth transistor T2-2 is the drain electrode of the second pull-up node control transistor T2 electrode.

The second output transistor T5 includes a seventeenth transistor T5-1 and an eighteenth transistor T5-2 connected in series with each other.

The gate electrode of the seventeenth transistor T5-1 is electrically connected to the gate electrode of the eighteenth transistor T5-2, the source electrode of the seventeenth transistor T5-1 is the source electrode of the second output transistor T5, the drain electrode of the seventeenth transistor T5-1 is electrically connected to the source electrode of the eighteenth transistor T5-2, and the drain electrode of the eighteenth transistor T5-2 is the drain electrode of the second output transistor T5 electrode.

The first pull-down node control transistor T9 includes a third transistor T9-1 and a fourth transistor T9-2 connected in series with each other; the second pull-down node control transistor T10 includes a fifth transistor T10-1 and a sixth transistor T10-2 connected in series with each other.

The gate electrode of the third transistor T9-1 is electrically connected to the gate electrode of the fourth transistor T9-2, the source electrode of the third transistor T9-1 is the source electrode of the first pull-down node control transistor T9, the drain electrode of the third transistor T9-1 is electrically connected to the source electrode of the fourth transistor T9-2, and the drain electrode of the fourth transistor T9-2 is the drain electrode of the first pull-down node control transistor T9 electrode.

The gate electrode of the fifth transistor T10-1 is electrically connected to the gate electrode of the sixth transistor T10-2, the source electrode of the fifth transistor T10-1 is the source electrode of the second pull-down node control transistor T10, the drain electrode of the fifth transistor T10-1 is electrically connected to the drain electrode of the sixth transistor T10-2, and the drain electrode of the sixth transistor T10-2 is the drain electrode of the second pull-down node control transistor T10.

The output control transistor T11 includes a first transistor T11-1 and a second transistor T11-2.

The gate electrode of the first transistor T11-1 is electrically connected to the gate electrode of the second transistor T11-2, the source electrode of the first transistor T11-1 is the source electrode of the output control transistor T11, the drain electrode of the first transistor T11-1 is electrically connected to the source electrode of the second transistor T11-2, and the drain electrode of the second transistor T11-2 is the drain electrode of the output control transistor T11.

The control transistor T8 includes a fifteenth transistor T8-1 and a sixteenth transistor T8-2 connected in series with each other.

The gate electrode of the fifteenth transistor T8-1 is electrically connected to the gate electrode of the sixteenth transistor T8-2. The source electrode of the fifteenth transistor T8-1 is the source electrode of the control transistor T8. The drain electrode of the fifteenth transistor T8-1 is electrically connected to the source electrode of the sixteenth transistor T8-2, and the drain electrode of the sixteenth transistor T8-2 is the drain electrode of the control transistor T8.

The second pull-down input node control transistor T6 includes a thirteenth transistor T6-1 and a fourteenth transistor T6-2.

The gate electrode of the thirteenth transistor T6-1 is electrically connected to the gate electrode of the fourteenth transistor T6-2, and the source electrode of the thirteenth transistor T6-1 is the source electrode of the second pull-down input node control transistor T6, the source electrode of the thirteenth transistor T6-1 is electrically connected to the source electrode of the fourteenth transistor T6-2, and the drain electrode of the fourteenth transistor T6-2 is the drain electrode of the second pull-down input node control transistor T6.

Compared with at least one embodiment of the shift register unit shown in FIG. 20 of the present disclosure, at least one embodiment of the shift register unit shown in FIG. 21 of the present disclosure replaces T8 with a series double-gate transistor to control the potential of PD_out more stable.

In at least one embodiment of the shift register unit shown in FIG. 21 of the present disclosure, T2, T5, T9, T10, T11, T3, T1, T6, and T8 are replaced with series double-gate transistors to ensure that the potential of the PU, the potential of PD_in, the potential of PD_f, the potential of PD_out, the potential of PD_ox, the potential of GP, and the potential of G2 are more stable, which is suitable for various commonly used frequency reduction driving methods.

The shift register unit according to at least one embodiment of the present disclosure can reduce the noise of the second gate driving signal outputted from the second gate driving signal output terminal to 0.27V by replacing the transistor with a series double-gate transistor (when the transistor is not replaced with a series double-gate transistor, the noise will reach 1.46V), the effect is obvious.

Figure 22:
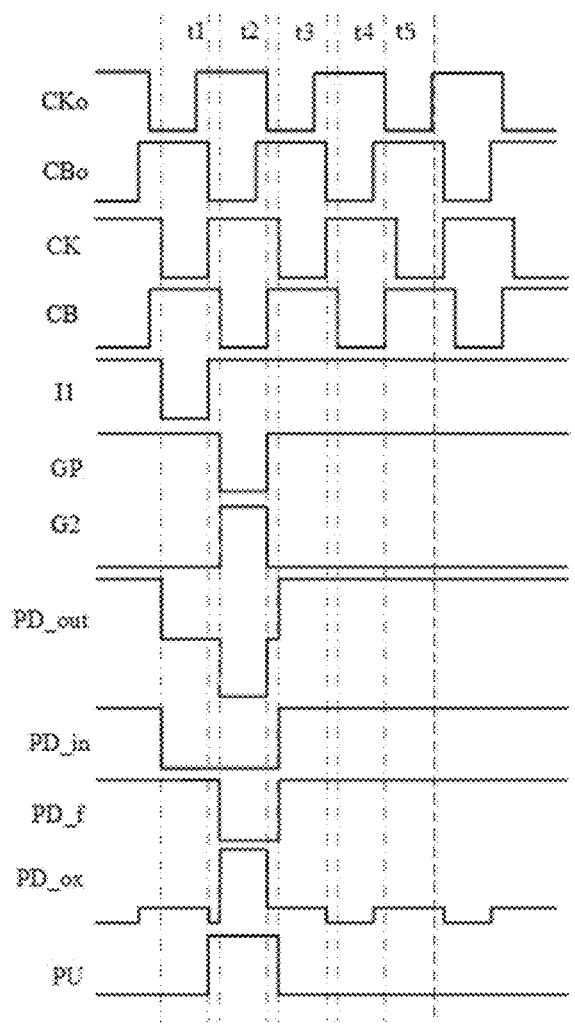
FIG. 22 is an operation timing diagram of the shift register unit shown in FIG. 18 according to at least one embodiment of the present disclosure, and an operation timing diagram of the shift register unit shown in FIG. 19 according to at least one embodiment of the present disclosure, an operation timing diagram of the shift register unit shown in FIG. 20 according to at least one embodiment of the present disclosure and an operation timing diagram of the shift register unit shown in FIG. 21 according to at least one embodiment of the present disclosure.

FIG. 22 shows the operation timing diagram of the shift register unit shown in FIG. 18, the operation timing diagram of the shift register unit shown in FIG. 19, the operation timing diagram of the shift register unit shown in FIG. 21, and the operation timing diagram of the shift register unit shown in FIG. 21.

As shown in FIG. 22, the third clock signal CK is different from the first clock signal CKo, the fourth clock signal CB is different from the second clock signal CBo, the falling edge of CKo is the same as the rising edge of CB, and the rising edge of CKo is not later than the rising edge of CK; the falling edge of CBo and the rising edge of CK are at the same time, the rising edge of CBo is not later than the rising edge of CB. Through the above adjustment, the reset time of G2 can be advanced to ensure the NMOS transistor and the PMOS transistor in the pixel circuit are turned on or off at the same time, and waiting due to differences is not necessary, thereby increasing the pixel charging time and supporting high resolution or high refresh rate driving.

In at least one embodiment of the present disclosure, the transistor in the pixel circuit whose gate electrode is connected to the first gate driving signal output terminal GP is a PMOS transistor. The transistor in the pixel circuit whose gate electrode is connected to the second gate driving signal output terminal G2 is a NMOS transistor.

In FIG. 22, the input phase is marked with t1, the output phase is marked with t2, the reset phase is marked with t3, the first maintenance sub-time period is marked with t4, and the second maintenance sub-time period is marked with t5.

In order to reduce the large noise outputted by the shift register unit at a low refresh frequency, to avoid affecting the normal retention of pixels, a parallel double-gate transistor is used to reduce the current leakage of the switching transistor having a source (or drain) electrode connected to a level signal reversed to that in the output cut-off maintenance phase, ensuring the output stability of GOA (Gate on Array) under low frequency driving, so as to realize the switching control signal required for the low-frequency driving of the pixel.

The control electrode of the parallel double-gate transistor includes a top gate and a bottom gate, and the parallel double-gate transistor includes a first electrode and a second electrode; in a specific implementation, the first electrode may be a source electrode, the second electrode may be a drain electrode; or the first electrode may be a drain electrode, and the second electrode may be a source electrode. In at least one embodiment of the present disclosure, the top gate of the dual-gate transistor connected in parallel and the bottom gate of the parallel dual-gate transistor are arranged to be short-circuited with each other, so as to reduce leakage current, but not limited thereto.

Figure 23:
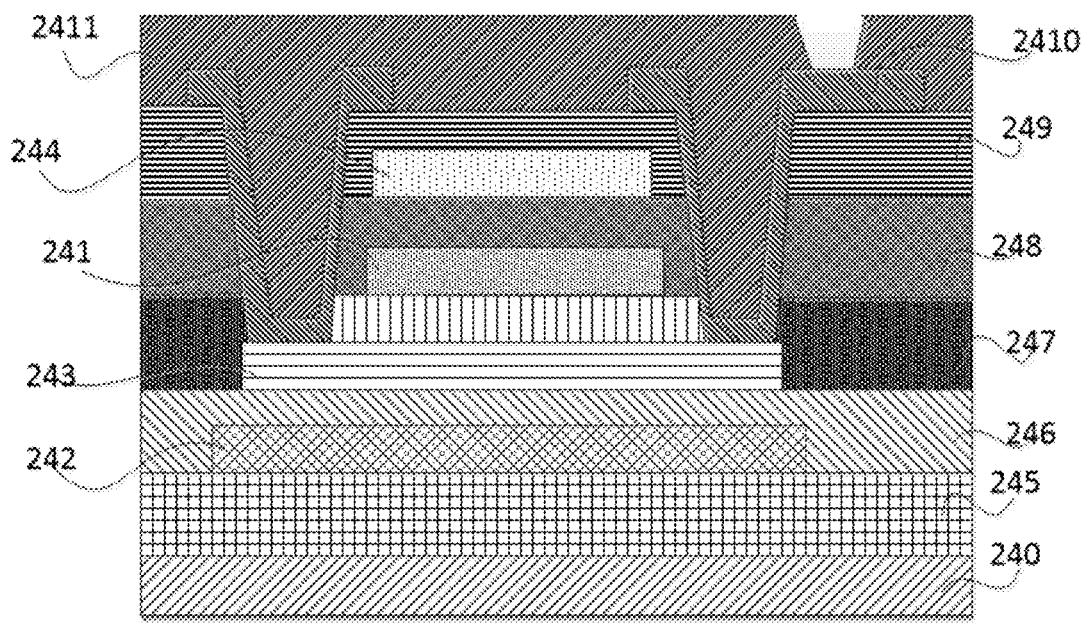
FIG. 23 is a cross-sectional structure diagram of double-gate transistors connected in parallel according to at least one embodiment of the present disclosure.

FIG. 23 is a cross-sectional structure diagram of a parallel double-gate transistor. As shown in FIG. 23, the first gate metal layer 241 includes the top gate of the parallel dual-gate transistor, and the light-shielding metal layer 242 includes the bottom gate of the parallel dual-gate transistor. The top gate of the parallel dual-gate transistor and the bottom gate of the parallel dual-gate transistor shares the P-type silicon (P-Si) active layer 243. In FIG. 23, the label 244 represents the second gate metal layer, the label 240 represents the glass substrate, the label 245 represents the first protective layer, the label 246 represents the buffer layer, and the label 247 represents the first gate insulating layer, the label 248 represents the second gate insulating layer, the label 249 represents the pixel defining layer, the label 2410 represents the source-drain metal layer, and the label 2411 represents the second protective layer.

Figure 24:
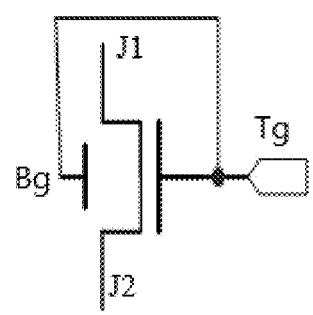
FIG. 24 is a structure diagram of double-gate transistors connected in parallel according to at least one embodiment of the present disclosure.

In at least one embodiment of the present disclosure, as shown in FIG. 24, the parallel double-gate transistor may include a top gate Tg, a bottom gate Bg, a first electrode J1 and a second electrode J2, the top gate Tg and the bottom gate Bg are short circuited.

Figure 25:
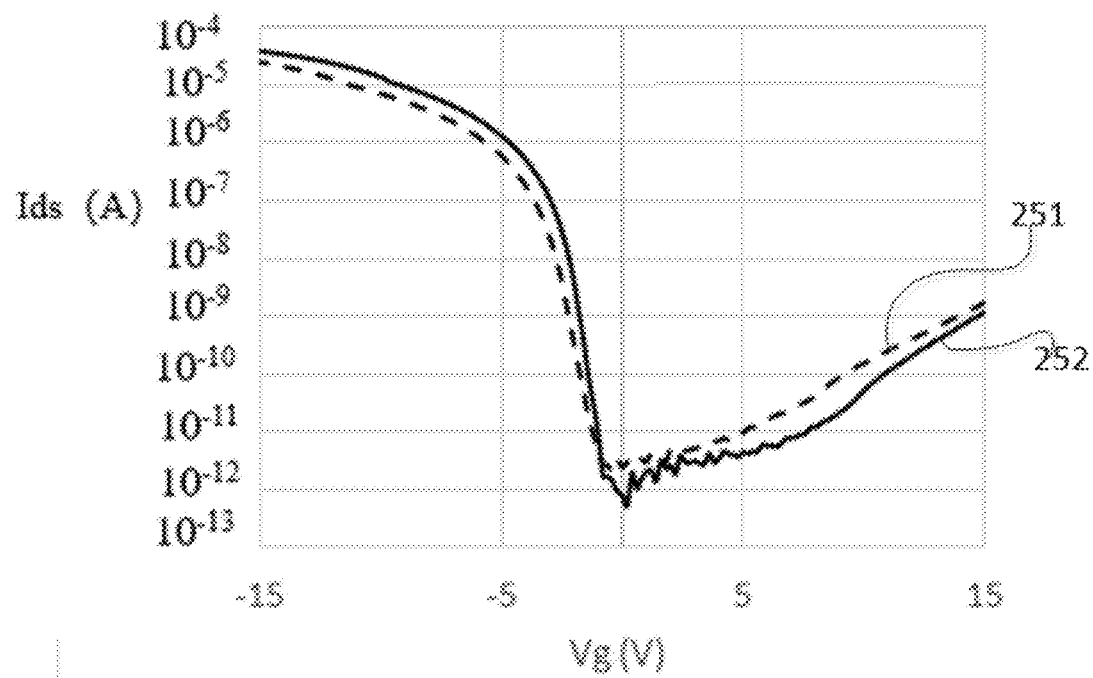
FIG. 25 is a schematic diagram showing the relationship between the top gate voltage Vg and the drain-source current Ids when 0V is applied to the bottom gate and the drain voltage of the double-gate transistors connected in parallel is −10.1V, and the relationship between the gate voltage Vg and the drain-source current Ids when the top gate and bottom gate are in a short connection and the drain voltage of the double gate transistors connected in parallel is −10.1V.

When the bottom gate is connected to 0V voltage and the drain voltage of the parallel double-gate transistor is −10.1V, the relationship between the top gate voltage Vg and the drain-source current Ids is shown by curve 251 in FIG. 25. In FIG. 25, the horizontal axis is Vg and the unit is V (volt), and the vertical axis is Ids and the unit is A (ampere).

When the top gate and the bottom gate are short circuited to each other, and the parallel double-gate transistor has a drain voltage of −10.1V, the relationship between the gate voltage Vg and the drain-source current Ids is shown by curve 252 in FIG. 25.

Comparing the curve 251 and the curve 252 in FIG. 25, it can be seen that under the same drain voltage, when the voltage of the top gate is equal to 0, the leakage current of the parallel double-gate transistor whose top and bottom gates are short-circuited to each other is less than the leakage current of the parallel double-gate transistor whose bottom gate is connected to 0V voltage.

Optionally, the output control transistor may be a parallel double-gate transistor, that is, the control electrode of the output control transistor may include a top gate and a bottom gate electrically connected to each other.

Optionally, the pull-down transistor may be a parallel double-gate transistor, that is, the control electrode of the pull-down transistor includes a top gate and a bottom gate electrically connected to each other.

Optionally, the first pull-down node control transistor may be a parallel double-gate transistor; and/or, the second pull-down node control transistor may be a parallel double-gate transistor; that is, the control electrode of the first pull-down node control transistor includes a top gate and a bottom gate electrically connected to each other; and/or, the control electrode of the second pull-down node control transistor includes a top gate and a bottom gate electrically connected to each other.

Optionally, the first pull-up node control transistor may be a parallel double-gate transistor; and/or, the second pull-up node control transistor may be a parallel double-gate transistor; that is, the control electrode of the first pull-up node control transistor includes a top gate and a bottom gate electrically connected to each other; and/or, the control electrode of the second pull-up node control transistor includes a top gate and a bottom gate electrically connected to each other.

Optionally, the first pull-down input node control transistor may be a parallel double-gate transistor, and/or, the second pull-down input node control transistor may be a parallel double-gate transistor; that is, the control electrode of the first pull-down input node control transistor includes a top gate and a bottom gate electrically connected to each other; and/or the control electrode of the second pull-down input node control transistor includes a top gate and a bottom gate electrically connected to each other.

Optionally, the control transistor may be a parallel double-gate transistor; and/or, the second output transistor may be a parallel double-gate transistor; that is, the control electrode of the control transistor includes a top gate and a bottom gate electrically connected to each other; and/or, the control electrode of the second output transistor includes a top gate and a bottom gate electrically connected to each other.

Optionally, the first output transistor may be a parallel double-gate transistor, and/or, the third pull-down input node control transistor may be a parallel double-gate transistor; that is, the control electrode of the first output transistor includes a top gate and a bottom gate electrically connected to each other; and/or the control electrode of the third pull-down input node control transistor includes a top gate and a bottom gate electrically connected to each other.

Figure 26:
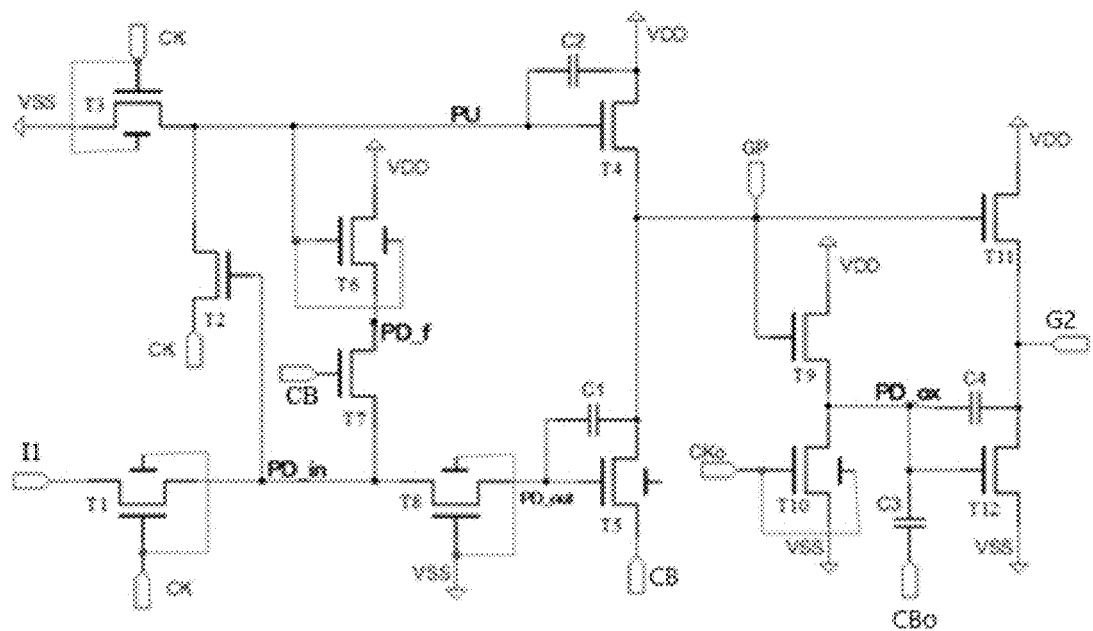
FIG. 26 is a circuit diagram of the shift register unit according to at least one embodiment of the present disclosure.

As shown in FIG. 26, on the basis of the shift register unit shown in FIG. 12 of the present disclosure, at least one embodiment of the shift register unit described in the present disclosure is as follows.

The first pull-up node control transistor T3 is a parallel double-gate transistor, the first pull-down input node control transistor T1 is a parallel double-gate transistor, and the second pull-down input node control transistor T6 is a parallel double-gate transistor; the control transistor T8 is a parallel double-gate transistor; the second pull-down node control transistor T10 is a parallel double-gate transistor.

The gate electrode of the first pull-up node control transistor T3 includes a top gate and a bottom gate short circuited to each other.

The gate electrode of the first pull-down input node control transistor T1 includes a top gate and a bottom gate short circuited to each other; the gate electrode of the second pull-down input node control transistor T6 includes a top gate and a bottom gate short circuited to each other.

The gate electrode of the control transistor T8 includes a top gate and a bottom gate short circuited to each other.

The gate electrode of the second pull-down node control transistor T10 includes a top gate and a bottom gate short circuited to each other.

In at least one embodiment of the shift register unit shown in FIG. 26 of the present disclosure, T3, T1, T6, T8, and T10 are replaced with parallel double-gate transistors to ensure the potential of PU, the potential of PD_in, the potential of PD_f, the potential of PD_out and the potential of PD_ox are stable, which is suitable for the frequency reduction driving method in which the row driving time is delayed.

Figure 27:
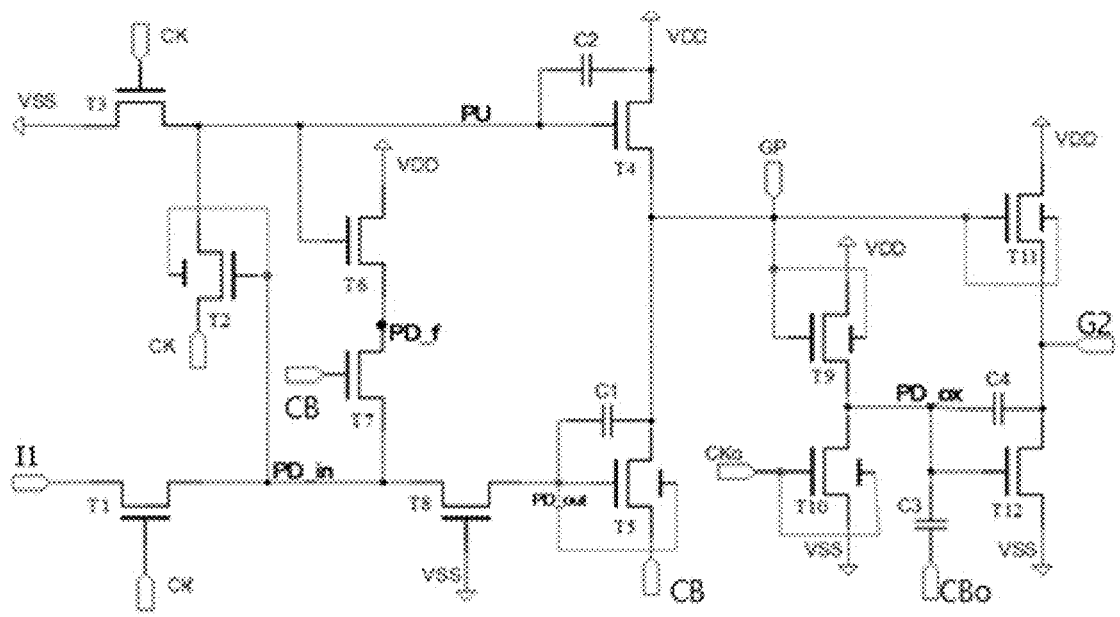
FIG. 27 is a circuit diagram of the shift register unit according to at least one embodiment of the present disclosure.

As shown in FIG. 27, on the basis of the shift register unit shown in FIG. 12 of the present disclosure, at least one embodiment of the shift register unit described in the present disclosure is as follows.

The second pull-up node control transistor T2 is a parallel double-gate transistor, the second output transistor T5 is a parallel double-gate transistor, and the first pull-down node control transistor T9 is a parallel double-gate transistor, and the second pull-down node control transistor T10 is a parallel double-gate transistor, and the output control transistor T11 is a parallel double-gate transistor.

The gate electrode of the second pull-up node control transistor T2 includes a top gate and a bottom gate short circuited to each other.

The gate electrode of the second output transistor T5 includes a top gate and a bottom gate short circuited to each other.

The gate electrode of the first pull-down node control transistor T9 includes a top gate and a bottom gate short circuited to each other; the gate electrode of the second pull-down node control transistor T10 includes a top gate and a bottom gate short circuited to each other.

The gate electrode of the output control transistor T11 includes a top gate and a bottom gate short circuited to each other.

In at least one embodiment of the shift register unit shown in FIG. 27 of the present disclosure, T2, T5, T9, T10, and T11 are replaced with parallel double-gate transistors to ensure that the potential of the GP and the potential of G2 are stable, which is suitable for Frame Skip frequency reduction driving method.

Figure 28:
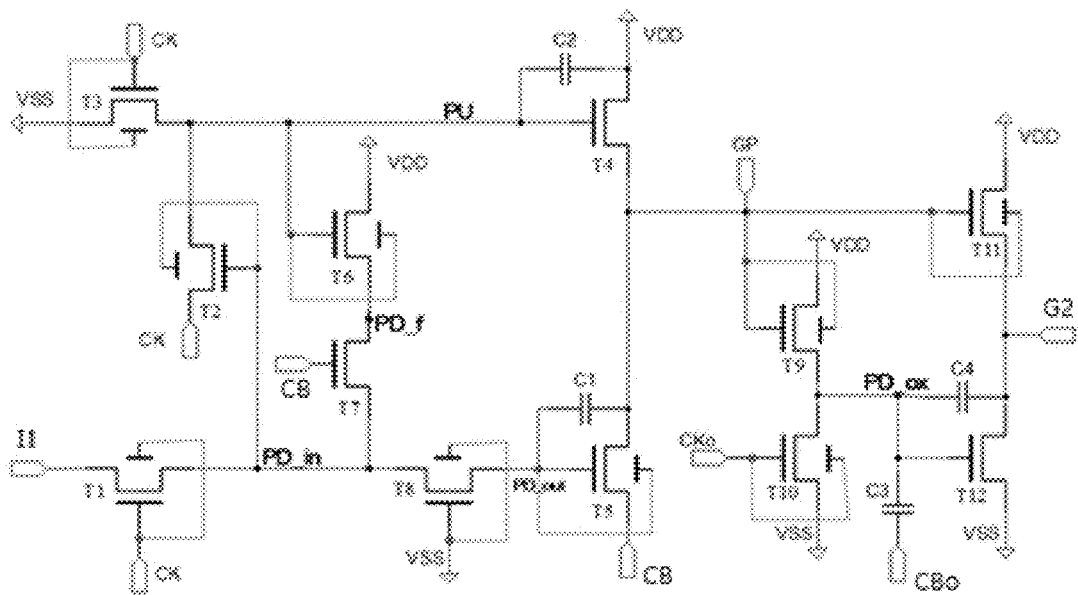
FIG. 28 is a circuit diagram of the shift register unit according to at least one embodiment of the present disclosure.

As shown in FIG. 28, on the basis of at least one embodiment of the shift register unit shown in FIG. 12 of the present disclosure, at least one embodiment of the shift register unit described in the present disclosure is as follows.

The second pull-up node control transistor T2 is a parallel double-gate transistor, the second output transistor T5 is a parallel double-gate transistor, and the first pull-down node control transistor T9 is a parallel double-gate transistor, and the second pull-down node control transistor T10 is a parallel double-gate transistor, the output control transistor T11 is a parallel double-gate transistor, the first pull-up node control transistor T3 is a parallel double-gate transistor, and the first pull-down input node control transistor T1 is a parallel double-gate transistor.

The gate electrode of the first pull-up node control transistor T3 includes a top gate and a bottom gate short circuited to each other.

The gate electrode of the first pull-down input node control transistor T1 includes a top gate and a bottom gate short circuited to each other.

The gate electrode of the second pull-up node control transistor T2 includes a top gate and a bottom gate short circuited to each other.

The gate electrode of the second output transistor T5 includes a top gate and a bottom gate short circuited to each other.

The gate electrode of the first pull-down node control transistor T9 includes a top gate and a bottom gate short circuited to each other; the gate electrode of the second pull-down node control transistor T10 includes a top gate and a bottom gate short circuited to each other.

The gate electrode of the output control transistor T11 includes a top gate and a bottom gate short circuited to each other.

In at least one embodiment of the shift register unit shown in FIG. 28 of the present disclosure, T2, T5, T9, T10, T11, T3, and T1 are replaced with parallel double-gate transistors to ensure the potential of PU, the potential of PD_in, the potential of PD_f, the potential of PD_out, the potential of PD_ox, the potential of GP, and the potential of G2 are more stable, which is suitable for various commonly used frequency reduction driving methods.

Figure 29:
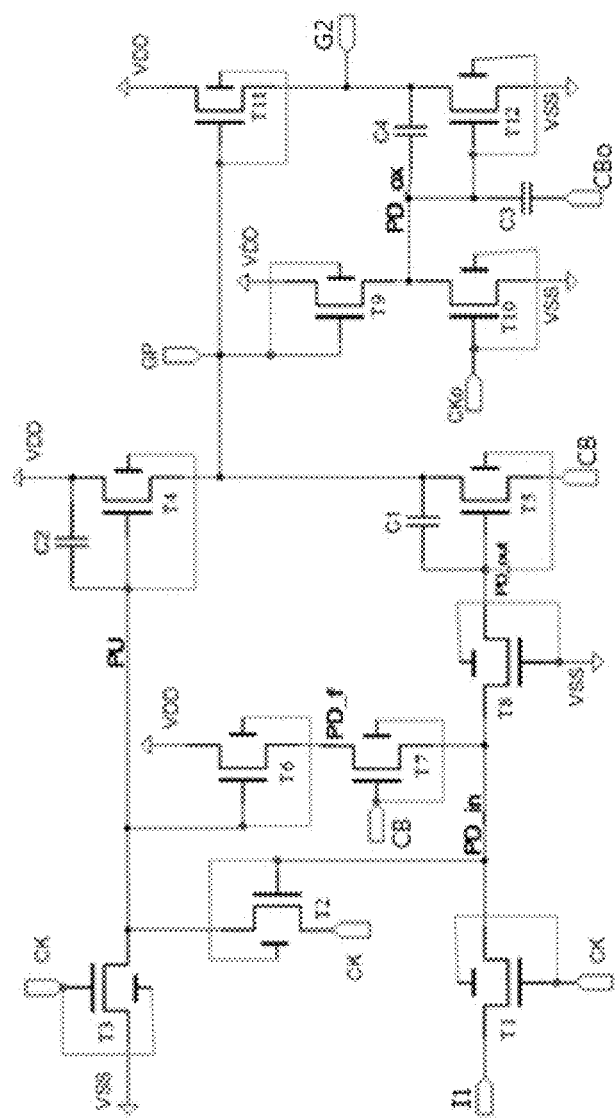
FIG. 29 is a circuit diagram of the shift register unit according to at least one embodiment of the present disclosure.

As shown in FIG. 29, on the basis of at least one embodiment of the shift register unit shown in FIG. 12 of the present disclosure, at least one embodiment of the shift register unit described in the present disclosure is as follows.

The second pull-up node control transistor T2 is a parallel double-gate transistor, the second output transistor T5 is a parallel double-gate transistor, and the first pull-down node control transistor T9 is a parallel double-gate transistor, and the second pull-down node control transistor T10 is a parallel double-gate transistor, the output control transistor T11 is a parallel double-gate transistor, the first pull-up node control transistor T3 is a parallel double-gate transistor, and the first pull-down input node control transistor T1 is a parallel double-gate transistor, the control transistor T8 is a parallel double-gate transistor; the first output transistor T4 is a parallel double-gate transistor; the second pull-down input node control transistor T6 is a parallel double-gate transistor; the third pull-down input node control transistor T7 is a parallel double-gate transistor, and the pull-down transistor T12 is a parallel double-gate transistor.

The gate electrode of the first pull-up node control transistor T3 includes a top gate and a bottom gate short circuited to each other.

The gate electrode of the first pull-down input node control transistor T1 includes a top gate and a bottom gate short circuited to each other.

The gate electrode of the second pull-up node control transistor T2 includes a top gate and a bottom gate short circuited to each other.

The gate electrode of the second output transistor T5 includes a top gate and a bottom gate short circuited to each other.

The gate electrode of the first pull-down node control transistor T9 includes a top gate and a bottom gate short circuited to each other; the gate of the second pull-down node control transistor T10 includes a top gate and a bottom gate short circuited to each other.

The gate electrode of the output control transistor T11 includes a top gate and a bottom gate short circuited to each other.

The gate electrode of the control transistor T8 includes a top gate and a bottom gate short circuited to each other.

The gate electrode of the first output transistor T4 includes a top gate and a bottom gate short circuited to each other.

The gate electrode of the second pull-down input node control transistor T6 includes a top gate and a bottom gate short circuited to each other.

The gate electrode of the third pull-down input node control transistor T7 includes a top gate and a bottom gate short circuited to each other.

The gate electrode of the pull-down transistor T12 includes a top gate and a bottom gate short circuited to each other.

At least one embodiment of the shift register unit shown in FIG. 29 of the present disclosure replaces all transistors with parallel double-gate transistors, ensuring the potential of PU, the potential of PD_in, the potential of PD_f, the potential of PD_out, the potential of PD_ox, the potential of GP and the potential of G2 are more stable, which is suitable for various commonly used frequency reduction driving methods.

The shift register unit according to at least one embodiment of the present disclosure can reduce the noise of the second gate driving signal outputted from the second gate driving signal output terminal from 1.46V to 0.26V by replacing the transistor with a parallel double-gate transistor, the effect is obvious.

Figure 30:
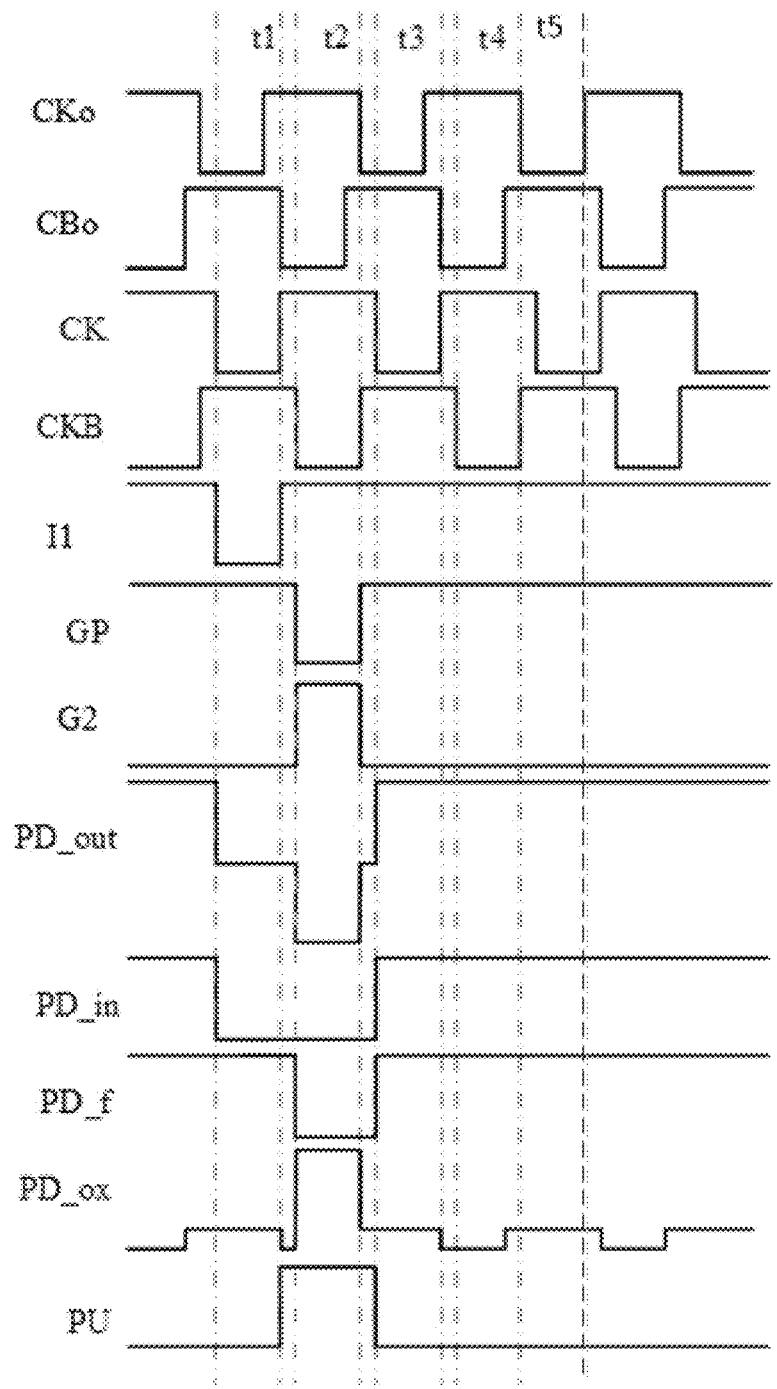
FIG. 30 is an operation timing diagram of the shift register unit shown in FIG. 26 according to at least one embodiment of the present disclosure, an operation timing diagram of the shift register unit shown in FIG. 27 according to at least one embodiment of the present disclosure, an operation timing diagram of the shift register unit shown in FIG. 28 according to at least one embodiment of the present disclosure and an operation timing diagram of the shift register unit shown in FIG. 29 according to at least one embodiment of the present disclosure.

FIG. 30 shows the operation timing diagram of the shift register unit shown in FIG. 26, the operation timing diagram of the shift register unit shown in FIG. 27, the operation timing diagram of the shift register unit shown in FIG. 29, and the operation timing diagram of the shift register unit shown in FIG. 29.

As shown in FIG. 30, the third clock signal CK is different from the first clock signal CKo, the fourth clock signal CB is different from the second clock signal CBo, the falling edge of CKo is the same as the rising edge of CB, and the rising edge of CKo is not later than the rising edge of CK; the falling edge of CBo and the rising edge of CK are at the same time, the rising edge of CBo is not later than the rising edge of CB. Through the above adjustment, the reset time of G2 can be advanced to ensure Oxide TFTs and PMOS TFTs in the pixel circuit are turned on or off at the same time, the waiting due to the difference is not necessary, thereby increasing the pixel charging time and supporting high resolution or high refresh rate driving.

In FIG. 30, the input phase is marked with t1, the output phase is marked with t2, the reset phase is marked with t3, the first maintenance sub-time period is marked with t4, and the second maintenance sub-time period is marked with t5.

The driving method according to at least one embodiment of the present disclosure is applied to the above shift register unit, and the driving method may include the following steps.

In the output phase, the first gate driving output circuit outputs the first level; the potential of the first clock signal is the second level, the potential of the second clock signal is the first level, and the second gate driving output circuit controls the potential of the second gate driving signal to be the second level under the control of the first gate driving signal.

In the reset phase, the first gate driving output circuit outputs a second level, the potential of the first clock signal is the first level, the potential of the second clock signal is the second level, and the second gate driving output circuit controls the potential of the second gate driving signal to be the first level under the control of the first clock signal.

In the output cut-off maintenance phase, the first gate driving output circuit outputs a second level, and the second gate driving output circuit controls the potential of the second gate driving signal to be the first level under the control of the first clock signal and the second clock signal.

In the method of driving the shift register unit according to at least one embodiment of the present disclosure, the second gate driving output circuit is added, the first gate driving signal, the first clock signal, and the second clock signal are used to generate an inverted second gate driving signal, so as to generate the positive and negative switching control signals required by the LTPO pixel through one stage of shift register unit.

In specific implementation, the first level may be a low level and the second level may be a high level; or, the first level may be a high level and the second level may be a low level; but not limited to this.

Specifically, the second gate driving circuit may include a first pull-down node control circuit, a pull-down circuit, and an output control circuit.

The controlling, by the second gate driving output circuit, the potential of the second gate driving signal to be the second level under the control of the first gate driving signal includes: controlling, by the output control circuit, the connection between the second gate driving signal output terminal and the first voltage terminal under the control of the first gate driving signal, so as to control the potential of the second gate driving signal to be the second level.

The controlling, by the second gate driving output circuit, the potential of the second gate driving signal to be the first level under the control of the first clock signal may include: controlling, by the first pull-down node control circuit, the connection between the first pull-down node and the third voltage terminal under the control of the first clock signal to control the potential of the first pull-down node to be the first level; and controlling, by the pull-down circuit, the connection between the second gate driving signal output terminal and the second voltage terminal under the control of the potential of the first pull-down node, to control the potential of the second gate driving signal to be the first level.

Specifically, the second gate driving circuit may include a first pull-down node control circuit, a pull-down circuit, and an output control circuit; the output cut-off maintenance phase includes a plurality of maintenance time periods set in sequence; the maintenance time period includes a first maintenance sub-time period and a second maintenance sub-time period set in sequence.

In the output cut-off maintenance phase, the first gate driving output circuit outputs the second level, and the second gate driving output circuit controls the potential of the second gate driving signal to be the first level under the control of the first clock signal and the second clock signal.

In the first maintenance sub-time period, the first gate driving output circuit outputs the second level, the potential of the first clock signal is the second level, and the potential of the second clock signal is the first level, the first pull-down node control circuit maintains the potential of the first pull-down node at the first level under the control of the second clock signal, and the pull-down circuit controls the connection between the second gate driving signal output terminal and the second voltage terminal under the control of the potential of the first pull-down node, to control the potential of the second gate driving signal to be the first level.

In the second maintenance sub-time period, the first gate driving output circuit outputs the second level, the potential of the first clock signal is the first level, the potential of the second clock signal is the second level, the first pull-node control circuit controls the connection between the first pull-down node and the third voltage terminal under the control of the first clock signal to control the potential of the first pull-down node to be the first level, and the pull-down circuit controls the connection between the second gate driving signal output terminal and the second voltage terminal under the control of the potential of the first pull-down node, to control the potential of the second gate driving signal to be the first level.

The gate driving circuit according to at least one embodiment of the present disclosure includes a plurality of stages of the above shift register units.

In a specific implementation, the shift register unit may include an input terminal, and the input terminal of the shift register unit is electrically connected to the first gate driving signal output terminal of an adjacent previous stage of shift register unit.

The display device according to at least one embodiment of the present disclosure includes the above-mentioned gate driving circuit.

The display device provided in at least one embodiment of the present disclosure may be any product or component with a display function such as a mobile phone, a tablet computer, a television, a display, a notebook computer, a digital photo frame, a navigator, and the like.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A shift register unit, comprising:
    a first gate driving output circuit; and
    a second gate driving output circuit,
    wherein the first gate driving output circuit is configured to output a first gate driving signal through a first gate driving signal output terminal,
    wherein the second gate driving output circuit is configured to generate a second gate driving signal based on the first gate driving signal, a first clock signal, and a second clock signal, and
    wherein the second gate driving circuit comprises:
        a first pull-down node control circuit;
        a pull-down circuit; and
        an output control circuit, the output control circuit being used to control connection or disconnection between a second gate driving signal output terminal and a first voltage terminal under the control of the first gate driving signal.

2. The shift register unit according to claim 1, wherein the first gate driving signal and the second gate driving signal are inverted in phase.

3. The shift register unit according to claim 1, wherein
    the first pull-down node control circuit is used to control a potential of a first pull-down node under the control of the first gate driving signal, the first clock signal, and the second clock signal; and
    the pull-down circuit is used to control connection or disconnection between the second gate driving signal output terminal and a second voltage terminal under the control of the potential of the first pull-down node.

4. The shift register unit according to claim 3, wherein the first pull-down node control circuit is electrically connected to a first gate driving signal output terminal, the first clock signal terminal, the second clock signal terminal, the first pull-down node, the first voltage terminal and a third voltage terminal, and is configured to control connection or disconnection between the first pull-down node and the first voltage terminal under the control of the first gate driving signal, control connection or disconnection between the first pull-down node and the third voltage terminal under the control of the first clock signal, and control the potential of the first pull-down node based on the second clock signal.

5. The shift register unit according to claim 3, wherein the first pull-down node control circuit is further configured to control the potential of the first pull-down node based on the second gate driving signal.

6. The shift register unit according to claim 3, wherein the first pull-down node control circuit comprises a first pull-down node control transistor, a second pull-down node control transistor, and a first pull-down node control capacitor,
- a control electrode of the first pull-down node control transistor is electrically connected to the first gate driving signal output terminal, and a first electrode of the first pull-down node control transistor is electrically connected to the first voltage terminal, and a second electrode of the first pull-down node control transistor is electrically connected to the first pull-down node;
- a control electrode of the second pull-down node control transistor is electrically connected to the first clock signal terminal, a first electrode of the second pull-down node control transistor is electrically connected to the first pull-down node, and a second electrode of the second pull-down node control transistor is electrically connected to the third voltage terminal; and
- a first terminal of the first pull-down node control capacitor is electrically connected to the first pull-down node, and a second terminal of the first pull-down node control capacitor is electrically connected to the second clock signal terminal.

7. The shift register unit according to claim 5, wherein the first pull-down node control circuit further comprises a second pull-down node control capacitor,
- a first terminal of the second pull-down node control capacitor is electrically connected to the first pull-down node, and a second terminal of the second pull-down node control capacitor is electrically connected to the second gate driving signal output terminal.

8. The shift register unit according to claim 1, wherein the output control circuit comprises an output control transistor,
- a control electrode of the output control transistor is electrically connected to the first gate driving signal output terminal, a first electrode of the output control transistor is electrically connected to the first voltage terminal, and a second electrode of the output control transistor is electrically connected to the second gate driving signal output terminal.

9. The shift register unit according to claim 8, wherein the output control transistor comprises a first transistor and a second transistor,
- a control electrode of the first transistor is electrically connected to a control electrode of the second transistor, a first electrode of the first transistor is the first electrode of the output control transistor, a second electrode of the first transistor is electrically connected to a first electrode of the second transistor, a second electrode of the second transistor is the second electrode of the output control transistor.

10. The shift register unit according to claim 8, wherein the control electrode of the output control transistor comprises a top gate and a bottom gate electrically connected to each other.

11. The shift register unit according to claim 3, wherein the pull-down circuit comprises a pull-down transistor,
- a control electrode of the pull-down transistor is electrically connected to the first pull-down node, a first electrode of the pull-down transistor is electrically connected to the second gate driving signal output terminal, and a second electrode of the pull-down transistor is electrically connected to the second voltage terminal.

12. The shift register unit according to claim 11, wherein the control electrode of the pull-down transistor comprises a top gate and a bottom gate electrically connected to each other.

13. A shift register unit, comprising:
a first gate driving output circuit; and
a second gate driving output circuit,
wherein the first gate driving output circuit is configured to output a first gate driving signal through a first gate driving signal output terminal,
wherein the second gate driving output circuit is configured to generate a second gate driving signal based on the first gate driving signal, a first clock signal, and a second clock signal,
wherein the first gate driving output circuit is used to control to output the first gate driving signal under the control of the third clock signal and the fourth clock signal,
wherein the first pull-down node control circuit includes a first pull-down node control transistor, a second pull-down node control transistor, a first pull-down node control capacitor, and a second pull-down node control capacitor, and the pull-down circuit includes a pull-down transistor,
wherein a control electrode of the first pull-down node control transistor is electrically connected to the first gate driving signal output terminal, and a first electrode of the first pull-down node control transistor is electrically connected to the first voltage terminal, and a second electrode of the first pull-down node control transistor is electrically connected to the first pull-down node,
wherein a control electrode of the second pull-down node control transistor is electrically connected to the first clock signal terminal, a first electrode of the second pull-down node control transistor is electrically connected to the first pull-down node, and a second electrode of the second pull-down node control transistor is electrically connected to the third voltage terminal,
wherein a first end of the first pull-down node control capacitor is electrically connected to the first pull-down node, and a second end of the first pull-down node control capacitor is electrically connected to the second clock signal terminal,
wherein a first end of the second pull-down node control capacitor is electrically connected to the first pull-down node, and a second end of the second pull-down node control capacitor is connected to the second gate driving signal output terminal, and
wherein a control electrode of the pull-down transistor is electrically connected to the first pull-down node, a first electrode of the pull-down transistor is electrically connected to the second gate driving signal output terminal, and a second electrode of the pull-down transistor is electrically connected to the second voltage terminal.

14. The shift register unit according to claim 6, wherein the first pull-down node control transistor includes a third transistor and a fourth transistor connected in series with each other; and/or, the second pull-down node control transistor includes a fifth transistor and a sixth transistor connected in series with each other;
- a control electrode of the third transistor is electrically connected to a control electrode of the fourth transistor, a first electrode of the third transistor is the first electrode of the first pull-down node control transistor, and a second electrode of the third transistor is electrically connected to a first electrode of the fourth transistor, a second electrode of the fourth transistor is the second electrode of the first pull-down node control transistor;

a control electrode of the fifth transistor is electrically connected to a control electrode of the sixth transistor, a first electrode of the fifth transistor is the first electrode of the second pull-down node control transistor, a second electrode of the fifth transistor is electrically connected to a first electrode of the sixth transistor, and a second electrode of the sixth transistor is the second electrode of the second pull-down node control transistor.

15. The shift register unit according to claim 6, wherein the control electrode of the first pull-down node control transistor includes a top gate and a bottom gate electrically connected to each other; and/or, the control electrode of the second pull-down node control transistor includes a top gate and a bottom gate electrically connected to each other.

16. The shift register unit according to claim 4, wherein the second voltage terminal is used to input a second voltage, and the third voltage terminal is used to input a third voltage;

transistors included in the first pull-down node control circuit and pull-down transistors included in the pull-down circuit are both p-type transistors, and the third voltage is less than the second voltage; or the transistors included in the first pull-down node control circuit and the pull-down transistors included in the pull-down circuit are n-type transistors, and the third voltage is greater than the second voltage.

17. The shift register unit according to claim 1, wherein the first gate driving output circuit includes a pull-up node control circuit, a pull-down input node control circuit, and a second pull-down node control circuit and an output circuit, the pull-up node control circuit is used to control the potential of the pull-up node under the control of the third clock signal and the potential of the pull-down input node, and maintain the potential of the pull-up node;

the pull-down input node control circuit is used to control connection or disconnection between the input terminal and the pull-down input node under the control of the third clock signal, and control connection or disconnection between the pull-down input node and the fourth voltage terminal under the control of the potential of the pull-up node and the fourth clock signal;

the second pull-down node control circuit is used to control connection or disconnection between the pull-down input node and the second pull-down node under the control of a fifth voltage signal, and maintain the potential of the second pull-down node;

the output circuit is used to control the first gate driving signal output terminal to output the first gate driving signal based on the fourth clock signal under the control of the potential of the pull-up node and the potential of the second pull-down node;

wherein the pull-up node control circuit includes a first pull-up node control transistor, a second pull-up node control transistor, and a pull-up node control capacitor, a control electrode of the first pull-up node control transistor is electrically connected to the third clock signal terminal, a first electrode of the first pull-up node control transistor is electrically connected to a sixth voltage terminal, and a second electrode of the first pull-up node control transistor is electrically connected to the pull-up node;

a control electrode of the second pull-up node control transistor is electrically connected to the pull-down input node, a first electrode of the second pull-up node control transistor is electrically connected to the pull-up node, and a second electrode of the second pull-up node control transistor is electrically connected to the third clock signal terminal; and a first end of the pull-up node control capacitor is electrically connected to the pull-up node, and a second end of the pull-up node control capacitor is electrically connected to a seventh voltage terminal;

wherein the first pull-up node control transistor includes a seventh transistor and an eighth transistor connected in series with each other; and/or the second pull-up node control transistor includes a ninth transistor and a tenth transistor connected in series;

a control electrode of the seventh transistor is electrically connected to a control electrode of the eighth transistor, a first electrode of the seventh transistor is the first electrode of the first pull-up node control transistor, a second electrode of the seventh transistor is electrically connected to a first electrode of the eighth transistor, a second electrode of the eighth transistor is the second electrode of the first pull-up node control transistor;

a control electrode of the ninth transistor is electrically connected to a control electrode of the tenth transistor, a first electrode of the ninth transistor is the first electrode of the second pull-up node control transistor, a second electrode of the ninth transistor is electrically connected to a first electrode of the tenth transistor, a second electrode of the tenth transistor is the second electrode of the second pull-up node control transistor; or wherein the control electrode of the first pull-up node control transistor includes a top gate and a bottom gate electrically connected to each other; and/or, the control electrode of the second pull-up node control transistor includes a top gate and a bottom gate electrically connected to each other;

wherein the pull-down input node control circuit includes a first pull-down input node control transistor, a second pull-down input node control transistor, and a third pull-down input node control transistor, a control electrode of the first pull-down input node control transistor is electrically connected to the third clock signal terminal, a first electrode of the first pull-down input node control transistor is electrically connected to the input terminal, and a second electrode of the first pull-down input node control transistor is electrically connected to the pull-down input node;

a control electrode of the second pull-down input node control transistor is electrically connected to the pull-up node, and a first electrode of the second pull-down input node control transistor is electrically connected to the fourth voltage terminal;

a control electrode of the third pull-down input node control transistor is electrically connected to the fourth clock signal terminal, and a first electrode of the third pull-down input node control transistor is electrically connected to the second electrode of the second pull-down input node control transistor, a second electrode of the third pull-down input node control transistor is electrically connected to the pull-down input node;

the second pull-down node control circuit includes a control transistor and a control capacitor;

a control electrode of the control transistor is electrically connected to the fifth voltage terminal, a first electrode of the control transistor is electrically connected to the pull-down input node, and a second electrode of the control transistor is electrically connected to the second pull-down node;

a first end of the control capacitor is electrically connected to the second pull-down node, and a second end of the control capacitor is electrically connected to the first gate driving signal output end;

the output circuit includes a first output transistor and a second output transistor;

a control electrode of the first output transistor is electrically connected to the pull-up node, a first electrode of the first output transistor is electrically connected to a seventh voltage terminal, and a second electrode of the first output transistor is electrically connected to the first gate driving signal output terminal;

a control electrode of the second output transistor is electrically connected to the second pull-down node, a first electrode of the second output transistor is electrically connected to the first gate driving signal output terminal, and a second electrode of the second output transistor is electrically connected to the fourth clock signal terminal;

wherein the first pull-down input node control transistor includes an eleventh transistor and a twelfth transistor; and/or the second pull-down input node control transistor includes a thirteenth transistor and a fourteenth transistor;

a control electrode of the eleventh transistor is electrically connected to a control electrode of the twelfth transistor, a first electrode of the eleventh transistor is the first electrode of the first pull-down input node control transistor, a second electrode of the eleventh transistor is electrically connected to a first electrode of the twelfth transistor, a second electrode of the twelfth transistor is the second electrode of the first pull-down input node control transistor;

a control electrode of the thirteenth transistor is electrically connected to a control electrode of the fourteenth transistor, a first electrode of the thirteenth transistor is the first electrode of the second pull-down input node control transistor, a second electrode of the thirteenth transistors is electrically connected to a first electrode of the fourteenth transistor, a second electrode of the fourteenth transistor is the second electrode of the second pull-down input node control transistor;

wherein the control transistor includes a fifteenth transistor and a sixteenth transistor connected in series with each other; and/or the second output transistor includes a seventeenth transistor and an eighteenth transistor connected in series with each other;

a control electrode of the fifteenth transistor is electrically connected to a control electrode of the sixteenth transistor, a first electrode of the fifteenth transistor is the first electrode of the control transistor, a second electrode of the fifteenth transistor is electrically connected to a first electrode of the sixteenth transistor, and a second electrode of the sixteenth transistor is the second electrode of the control transistor;

a control electrode of the seventeenth transistor is electrically connected to a control electrode of the eighteenth transistor, a first electrode of the seventeenth transistor is the first electrode of the second output transistor, and a second electrode of the seventeenth transistor is electrically connected to a first electrode of the eighteenth transistor, and a second electrode of the eighteenth transistor is the second electrode of the second output transistor;

wherein the control electrode of the first pull-down input node control transistor includes a top gate and a bottom gate electrically connected to each other; and/or the control electrode of the second pull-down input node control transistor includes a top gate and a bottom gate electrically connected to each other;

wherein the control electrode of the control transistor includes a top gate and a bottom gate electrically connected to each other; and/or the control electrode of the second output transistor includes a top gate and a bottom gate electrically connected to each other;

wherein the control electrode of the first output transistor includes a top gate and a bottom gate electrically connected to each other; and/or the control electrode of the third pull-down input node control transistor includes a top gate and a bottom gate electrically connected to each other.

18. A driving method applied to a shift register unit, wherein the shift register unit comprises a first gate driving output circuit and a second gate driving output circuit, wherein the first gate driving output circuit is configured to output a first gate driving signal through a first gate driving signal output terminal, wherein the second gate driving output circuit is configured to generate a second gate driving signal based on the first gate driving signal, a first clock signal, and a second clock signal, wherein the second gate driving circuit comprises a first pull-down node control circuit, a pull-down circuit, and an output control circuit, and wherein the output control circuit is used to control connection or disconnection between a second gate driving signal output terminal and a first voltage terminal under the control of the first gate driving signal, wherein the driving method comprises:

in an output phase, the first gate driving output circuit outputting the first level; the potential of the first clock signal being the second level, the potential of the second clock signal being the first level, and the second gate driving output circuit controlling the potential of the second gate driving signal to be the second level under the control of the first gate driving signal;

in a reset phase, the first gate driving output circuit outputting the second level, the potential of the first clock signal being the first level, the potential of the second clock signal being the second level, and the second gate driving output circuit controlling the potential of the second gate driving signal to be the first level under the control of the first clock signal; and in an output cut-off maintenance phase, the first gate driving output circuit outputting the second level, and the second gate driving output circuit controlling the potential of the second gate driving signal to be the first level under the control of the first clock signal and the second clock signal.

19. The driving method according to claim 18, wherein the second gate driving output circuit controlling the potential of the second gate driving signal to be the second level under the control of the first gate driving signal includes: controlling, by the output control circuit, the connection between the second gate driving signal output terminal and the first voltage terminal under the control of the first gate driving signal, so as to control the potential of the second gate driving signal to be the second level; and the second gate driving output circuit controlling the potential of the second gate driving signal to be the first level under the control of the first clock signal includes: controlling, by the first pull-down node control circuit, connection between the first pull-down node and the third voltage terminal under the control of the first clock signal to control the potential of the first pull-down node to be the first level; and controlling, by the pull-down circuit, connection between the second gate driving signal output terminal and the second voltage terminal under the control of the potential of the first pull-down node, to control the potential of the second gate driving signal to be the first level.

20. The driving method according to claim 18, wherein the output cut-off maintenance phase includes a plurality of maintenance time periods set in sequence; the maintenance time period includes a first maintenance sub-time period and a second maintenance sub-time period set in sequence;

in the output cut-off maintenance phase, the first gate driving output circuit outputting the second level, and the second gate driving output circuit controlling the potential of the second gate driving signal to be the first level under the control of the first clock signal and the second clock signal includes:

in the first maintenance sub-time period, the first gate driving output circuit outputting the second level, the potential of the first clock signal being the second level, and the potential of the second clock signal being the first level, the first pull-down node control circuit maintaining the potential of the first pull-down node at the first level under the control of the second clock signal, and the pull-down circuit controlling connection between the second gate driving signal output terminal and the second voltage terminal under the control of the potential of the first pull-down node, to control the potential of the second gate driving signal to be the first level; and in the second maintenance sub-time period, the first gate driving output circuit outputting the second level, the potential of the first clock signal being the first level, the potential of the second clock signal being the second level, the first pull-node control circuit controlling connection between the first pull-down node and the third voltage terminal under the control of the first clock signal to control the potential of the first pull-down node to be the first level, and the pull-down circuit controlling connection between the second gate driving signal output terminal and the second voltage terminal under the control of the potential of the first pull-down node, to control the potential of the second gate driving signal to be the first level.

* * * * *